United States Patent
Yajima et al.

(10) Patent No.: US 12,095,348 B2
(45) Date of Patent: Sep. 17, 2024

(54) CURRENT SENSOR AND POWER CONVERSION CIRCUIT

(71) Applicant: JAPAN SCIENCE AND TECHNOLOGY AGENCY, Kawaguchi (JP)

(72) Inventors: Takeaki Yajima, Fukuoka (JP); Akira Toriumi, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 242 days.

(21) Appl. No.: 17/769,919

(22) PCT Filed: Oct. 28, 2020

(86) PCT No.: PCT/JP2020/040436
§ 371 (c)(1),
(2) Date: Apr. 18, 2022

(87) PCT Pub. No.: WO2021/085475
PCT Pub. Date: May 6, 2021

(65) Prior Publication Data
US 2022/0393563 A1 Dec. 8, 2022

(30) Foreign Application Priority Data
Nov. 1, 2019 (JP) ................. 2019-200205

(51) Int. Cl.
*H02M 1/00* (2007.01)
*G01R 15/09* (2006.01)
*H02M 3/156* (2006.01)
*H02M 7/12* (2006.01)

(52) U.S. Cl.
CPC .......... *H02M 1/0009* (2021.05); *G01R 15/09* (2013.01); *H02M 3/156* (2013.01); *H02M 7/12* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 4,725,791 A 2/1988 Susak et al.
6,815,744 B1 11/2004 Beck et al.
(Continued)

FOREIGN PATENT DOCUMENTS

JP 863-135868 A 6/1988
JP H01-500707 A 3/1989
(Continued)

OTHER PUBLICATIONS

Fukai, Shuji et al., "Current Monitor Circuit with Cascode Amplifier Using Crystalline IGZO FETs Compatible with Low-Voltage Input to Detect Micro Short-Circuit in Lithium Ion Battery", Extended Abstracts of the 2019 International Conference on Solid State Devices and Materials, 2019, pp. 707-708; (2 pages).
(Continued)

*Primary Examiner* — Jeffrey A Gblende
(74) *Attorney, Agent, or Firm* — WHDA, LLP

(57) ABSTRACT

A current sensor includes an element that is in a high-resistance state when an absolute value of a current flowing between a first terminal and a second terminal is within a first range, and changes to a low-resistance state in which a resistance value is lower than that in the high-resistance state when the absolute value of the current exceeds the first range, and a circuit that supplies a current to be measured to the element, and senses a value of the current to be measured based on at least one of voltages of the first terminal and the second terminal.

11 Claims, 22 Drawing Sheets

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H05B 39/048; B23K 11/24; H04B 2215/069
See application file for complete search history.

(56) References Cited

U.S. PATENT DOCUMENTS

| | | | |
|---|---|---|---|
| 9,602,014 B2* | 3/2017 | Lin | H02M 3/33523 |
| 9,791,480 B2* | 10/2017 | Qin | G01R 19/0092 |
| 9,863,982 B2* | 1/2018 | Guntreddi | H02M 3/156 |
| 10,224,800 B2* | 3/2019 | Lu | H02M 3/158 |
| 10,476,496 B2* | 11/2019 | Horiguchi | H03K 17/163 |
| 2009/0152526 A1 | 6/2009 | Courtade et al. | |
| 2013/0169297 A1 | 7/2013 | Pilz | |
| 2015/0280119 A1 | 10/2015 | Hsu et al. | |
| 2016/0344302 A1 | 11/2016 | Inoue | |
| 2016/0356817 A1 | 12/2016 | Sievert et al. | |
| 2017/0302193 A1 | 10/2017 | Zhang et al. | |

FOREIGN PATENT DOCUMENTS

| | | |
|---|---|---|
| JP | 2000-206155 A | 7/2000 |
| JP | 2002-537627 A | 11/2002 |
| JP | 2004-198143 A | 7/2004 |
| JP | 2006-300677 A | 11/2006 |
| JP | 2007-068194 A | 3/2007 |
| JP | 2007-271401 A | 10/2007 |
| JP | 2008-235427 A | 10/2008 |
| JP | 2009-164580 A | 7/2009 |
| JP | 2010-287582 A | 12/2010 |
| JP | 2015-185842 A | 10/2015 |
| JP | 2016-220351 A | 12/2016 |
| JP | 2017-505914 A | 2/2017 |

OTHER PUBLICATIONS

International Search Report dated Dec. 28, 2020, issued in counterpart Application No. PCT/JP2020/040436, with English Translation. (7 pages).

* cited by examiner

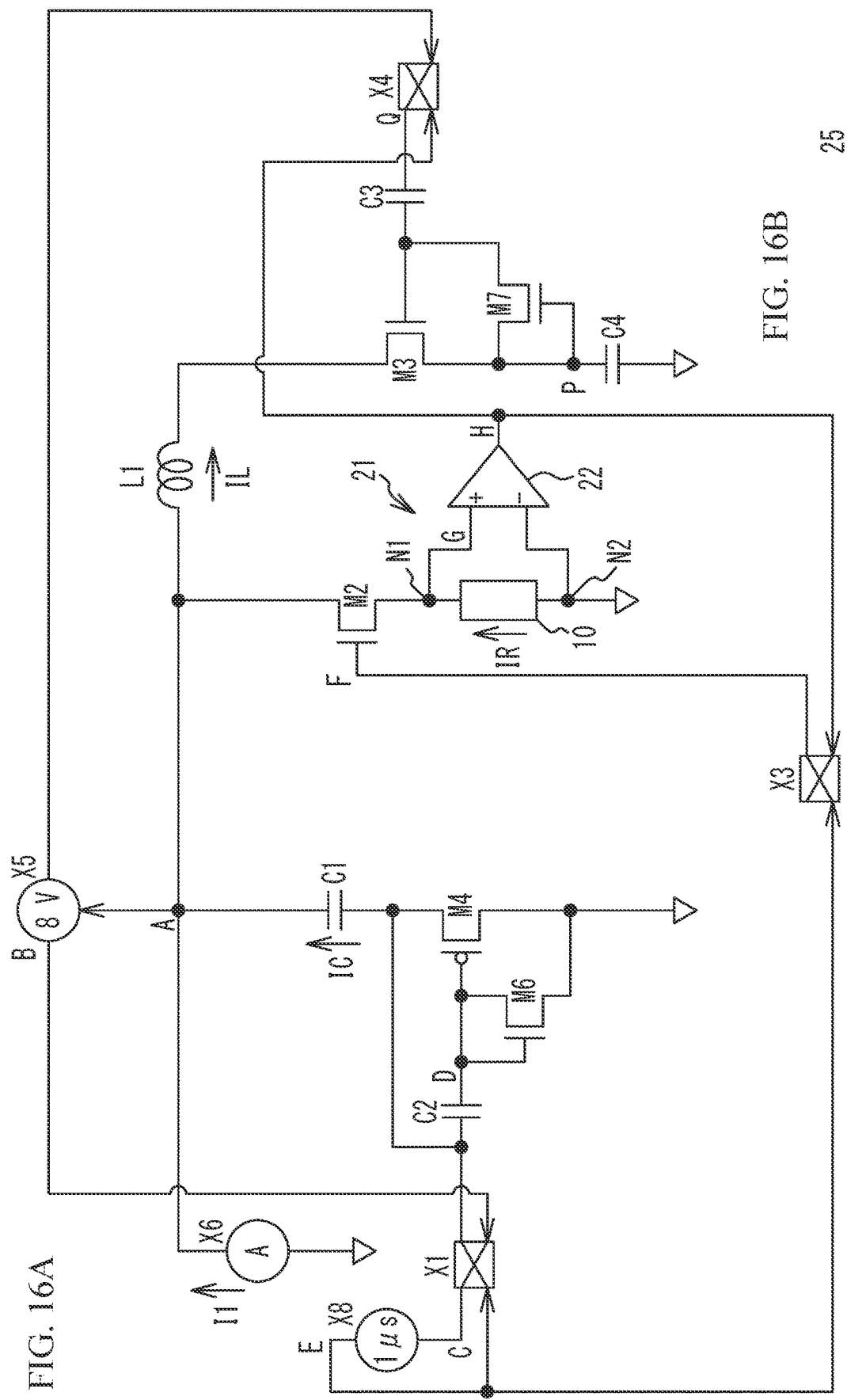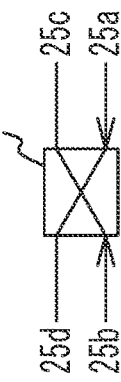
FIG. 16A
FIG. 16B

CURRENT SENSOR AND POWER CONVERSION CIRCUIT

TECHNICAL FIELD

The present invention relates to a current sensor and a power conversion circuit.

BACKGROUND ART

A current sensor that senses current by sensing both ends of a resistor through which the current flows is known (e.g., Non-Patent Document 1). In a detector that detects current using the on-resistance of a field effect transistor (FET), it is known to switch the measurement range by switching the voltage applied to the gate of the FET (e.g., Patent Document 1).

PRIOR ART DOCUMENT

Patent Document

Patent Document 1: Japanese Patent Application Publication No. 2006-300677

Non-Patent Document

Non-Patent Document 1: Extended Abstracts of the 2019 International Conference on Solid State Devices and Materials, 2019, pp707-708

SUMMARY OF THE INVENTION

Problem to be Solved by the Invention

Non-Patent Document 1 is an example, and current sensors that sense current flowing through a resistor on the basis of a detected value such as the voltage drop between both ends of the resistor are commonly used. In such current sensors, a resistor with low resistance is used to reduce the voltage drop and the loss when current flows. However, when the resistance is low, the value of the voltage drop becomes small, making it difficult to increase the detection accuracy. In addition, in Patent Document 1, a circuit that switches the voltage applied to the gate of the FET for switching the measurement range is used, making it difficult to miniaturize the current sensor.

The present invention has been made in view of above problems, and its first objective is to provide a current sensor that can be miniaturized, reduces the loss, and has a high detection accuracy.

A second objective of the present invention is to provide a power conversion circuit using the above current sensor.

Means for Solving the Problem

According to certain embodiments of the present invention, a current sensor includes: an element that is in a high-resistance state when an absolute value of a current flowing between a first terminal and a second terminal is within a first range, and changes to a low-resistance state in which a resistance value is lower than that in the high-resistance state when the absolute value of the current exceeds the first range; and a circuit that supplies a current to be measured to the element, and senses a value of the current to be measured based on at least one of voltages of the first terminal and the second terminal.

In the above configuration, the circuit may sense the value of the current based on a difference between the voltages of the first terminal and the second terminal.

In the above configuration, the circuit may sense the value of the current based on the voltage of the first terminal and a reference voltage that is supplied.

In the above configuration, the element may be a two-terminal element including a resistance element connected between the first terminal and the second terminal.

In the above configuration, the resistance element may be a resistance element that is in the high-resistance state when a temperature of the resistance element is within a first temperature range, and changes to the low-resistance state when the temperature of the resistance element is higher than the first temperature range.

In the above configuration, the resistance element may include $VO_2$, $NbO_2$, or $Ti_2O_3$.

In the above configuration, the element may include a first element and a second element that are connected in parallel between the first end and the second end, each of the first and second elements entering the high-resistance state without being controlled from an outside when a current flowing from a first end to a second end is equal to or less than a threshold current, and entering the low-resistance state without being controlled from the outside when the current flowing from the first end to the second end is greater than the threshold current, and the first end of the first element may be coupled to the first terminal, the second end of the first element may be coupled to the second terminal, the first end of the second element may be coupled to the second terminal, and the second end of the second element may be coupled to the first terminal.

According to certain embodiments of the present invention, a current sensor includes: an element or a circuit that enters a high-resistance state without being controlled from an outside when an absolute value of a current flowing between a first terminal and a second terminal is within a first range, and enters a low-resistance state in which a resistance value is lower than that in the high-resistance state without being controlled from the outside when the absolute value of the current is within a second range higher than the first range, wherein the current sensor senses the current.

According to certain embodiments of the present invention, a power conversion circuit includes: a switch element; and a control unit that controls turning on and off of the switch element based on an output of the above current sensor.

In the above configuration, the switch element may include: a first switch element connected between a first terminal and a second terminal, a second switch element connected between a third terminal and a fourth terminal, a third switch element connected between the first terminal and the fourth terminal, and a fourth switch element connected between the second terminal and the third terminal, the element may be coupled to one of the following locations: between the first terminal and the first and third switch elements, and between the second terminal and the first and fourth switch elements, and the control unit may turn the first switch element and the second switch element from OFF to ON and the third switch element and the fourth switch element from ON to OFF based on change of a sign of the current, and may turn the first switch element and the second switch element from ON to OFF and the third switch element and the fourth switch element from OFF to ON based on next change of the sign of the current.

Effects of the Invention

The present invention can provide a current sensor that can be miniaturized, reduces the loss, and has a high detection accuracy. In addition, a power conversion circuit using the above current sensor can be provided.

BRIEF DESCRIPTION OF THE DRAWINGS

FIG. 16A is a circuit diagram of the step-down circuit in the second variation of the second embodiment, and FIG. 16B illustrates a flip-flop circuit;

MODES FOR CARRYING OUT THE INVENTION

Hereinafter, with reference to the drawings, embodiments will be described.

First Embodiment

Figure 1A:
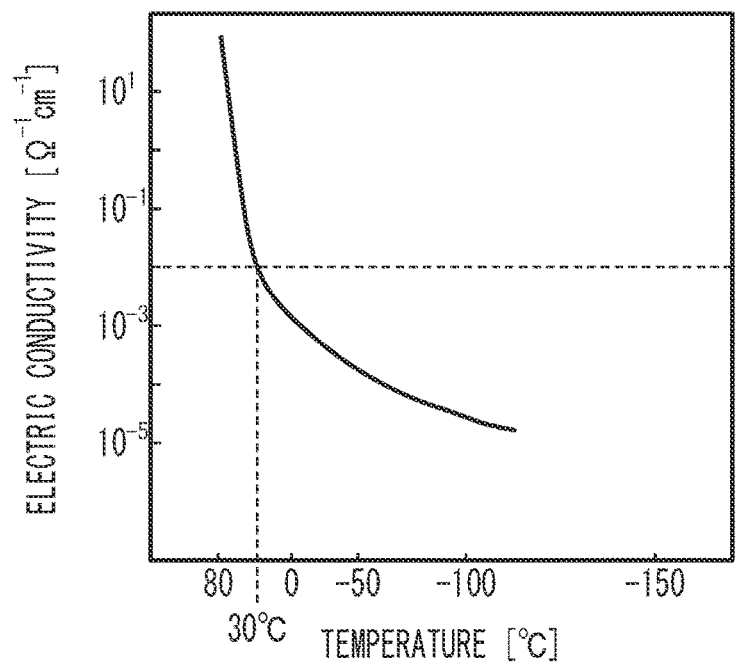
FIG. 1A is a graph of the electric conductivity of vanadium dioxide versus temperature.

Vanadium dioxide ($VO_2$) will be described as an example of an element used in a first embodiment. FIG. 1A is a graph of the electric conductivity of vanadium dioxide versus temperature.

As presented in FIG. 1A, as the temperature increases, the electric conductivity of vanadium dioxide increases. In the example of FIG. 1A, the electric conductivity increases rapidly when the temperature exceeds 30° C. At or below 30° C., the electric conductivity is low. This is due to the fact that vanadium dioxide is in a tetragonal metallic phase at high temperatures, but is in a monoclinic insulator phase at low temperatures.

Figure 1B:
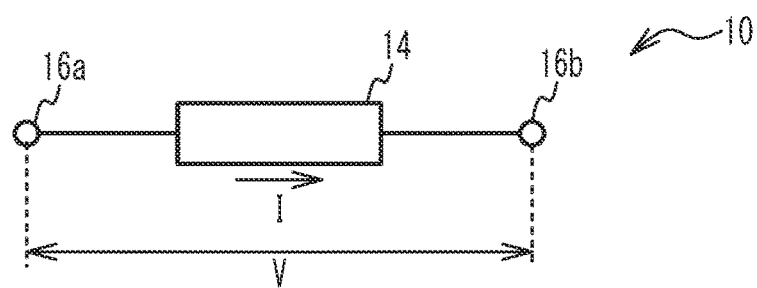
FIG. 1B illustrates an element using vanadium dioxide as a resistance element.

FIG. 1B illustrates an element using vanadium dioxide as a resistance element. In an element 10, a resistance element 14 is connected between electrodes 16a and 16b. The current flowing through the resistance element 14 is represented by I, and the voltage V between the electrodes 16a and 16b is represented by V.

Figure 1C:
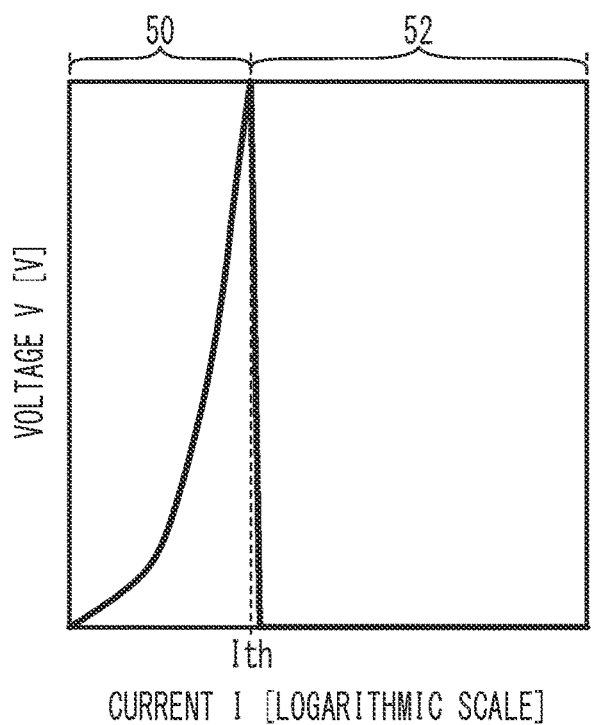
FIG. 1C is a graph of voltage V versus current I (logarithmic scale) in the element using vanadium dioxide.

FIG. 1C is a graph of voltage V versus current I (logarithmic scale) in the element using vanadium dioxide. As illustrated in FIG. 1C, in a range 50 where the current I is smaller than a threshold current Ith, the temperature of the resistance element 14 is low, and vanadium dioxide is in an insulator phase. Therefore, the resistance element 14 is in a high-resistance state in which the resistance element 14 has a high resistance. Therefore, as the current I increases, the voltage V increases. As the current I increases, the temperature of the resistance element 14 increases. When the current I becomes the threshold current Ith, the temperature of vanadium dioxide becomes the temperature at which the phase transition from the insulator phase to the metallic phase occurs. Thus, in a range 52 where the current I is equal to or greater than the threshold current Ith, the resistance element 14 is in a low-resistance state. Thus, the voltage is approximately 0 even when the current increases. A resistance element having characteristics with hysteresis in the current-voltage characteristics may be used. That is, the threshold current Ith when the current I is increased and the threshold current Ith when the current I is decreased may be different.

Figure 2A:
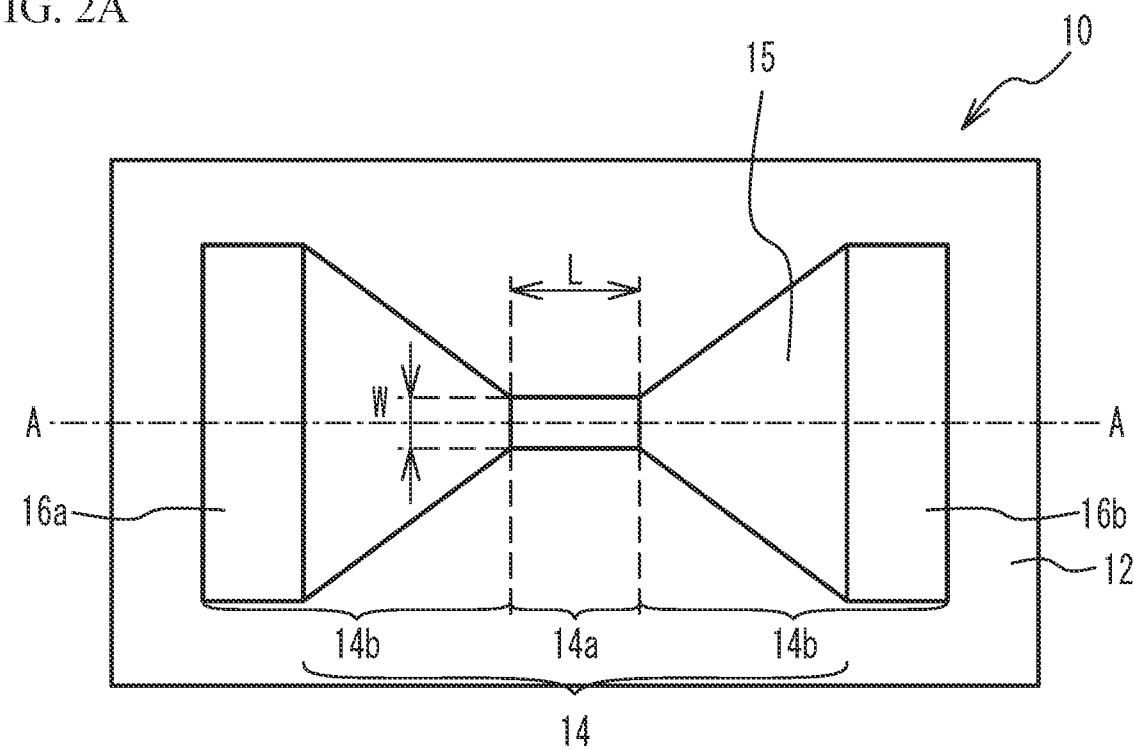
FIG. 2A is a plan view of an element in accordance with a first embodiment.
Figure 2B:
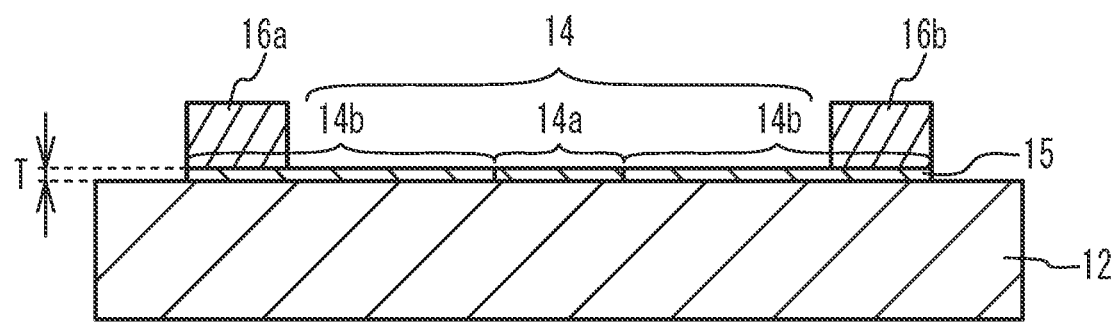
FIG. 2B is a cross-sectional view taken along line A-A in FIG. 2A.

FIG. 2A is a plan view of an element in accordance with the first embodiment, and FIG. 2B is a cross-sectional view taken along line A-A in FIG. 2A. As illustrated in FIG. 2A and FIG. 2B, the element 10 includes a substrate 12, the resistance element 14, and the electrodes 16a and 16b. A thin film 15 made of the resistance element 14 is formed on the substrate 12. The electrodes 16a and 16b are formed on respective ends of the resistance element 14. The resistance element 14 includes an active portion 14a and extraction portions 14b. The length of the active portion 14a in the direction in which current flows is represented by L, and the width is represented by W. The extraction portions 14b electrically connect the active portion 14a to the respective electrodes 16a and 16b. Each of the extraction portions 14b has a width gradually increasing at closer distances to the corresponding electrode 16a or 16b from the active portion 14a. The voltage between the electrodes 16a and 16b mainly concentrates in the active portion 14a. Thus, the variation in resistance of the element 10 is mainly the variation in resistance of the active portion 14a.

The substrate 12 is an insulating substrate such as, for example, a silicon (Si) substrate having silicon oxide ($SiO_2$) provided on the upper surface thereof, a titanium oxide ($TiO_2$) substrate, or an aluminum oxide ($Al_2O_3$) substrate. The substrate 12 may be any substrate as long as the resistance element 14 having desired characteristics can be formed. The resistance element 14 is a vanadium dioxide ($VO_2$) thin film. The electrode 16 is formed of a metal such as, for example, a gold (Au) layer, a copper (Cu) layer, or an aluminum (Al) layer.

To prevent heat from being released from the resistance element 14 to the substrate 12, a low thermal conductivity layer having a lower thermal conductivity than the substrate 12 may be provided between the substrate 12 and the resistance element 14. For example, an amorphous layer such as amorphous $SiO_2$ or a porous layer is used as the low thermal conductivity layer. The threshold current Ith can be adjusted to a desired value by appropriately designing the materials of the substrate 12 and the low thermal conductivity layer, and the length L, the width W, and the thickness T of the active portion 14a.

The element 10 was fabricated to measure the current-voltage characteristics. The substrate 12 is a monocrystalline $TiO_2$ substrate having (101) as the principal surface. The resistance element 14 is a $VO_2$ film formed using the pulsed laser deposition method. The length L, the width W, and the thickness T of the active portion 14a were adjusted to be 10 μm, 40 μm, and 90 nm, respectively. The electrodes 16a and 16b are gold layers.

Figure 3:
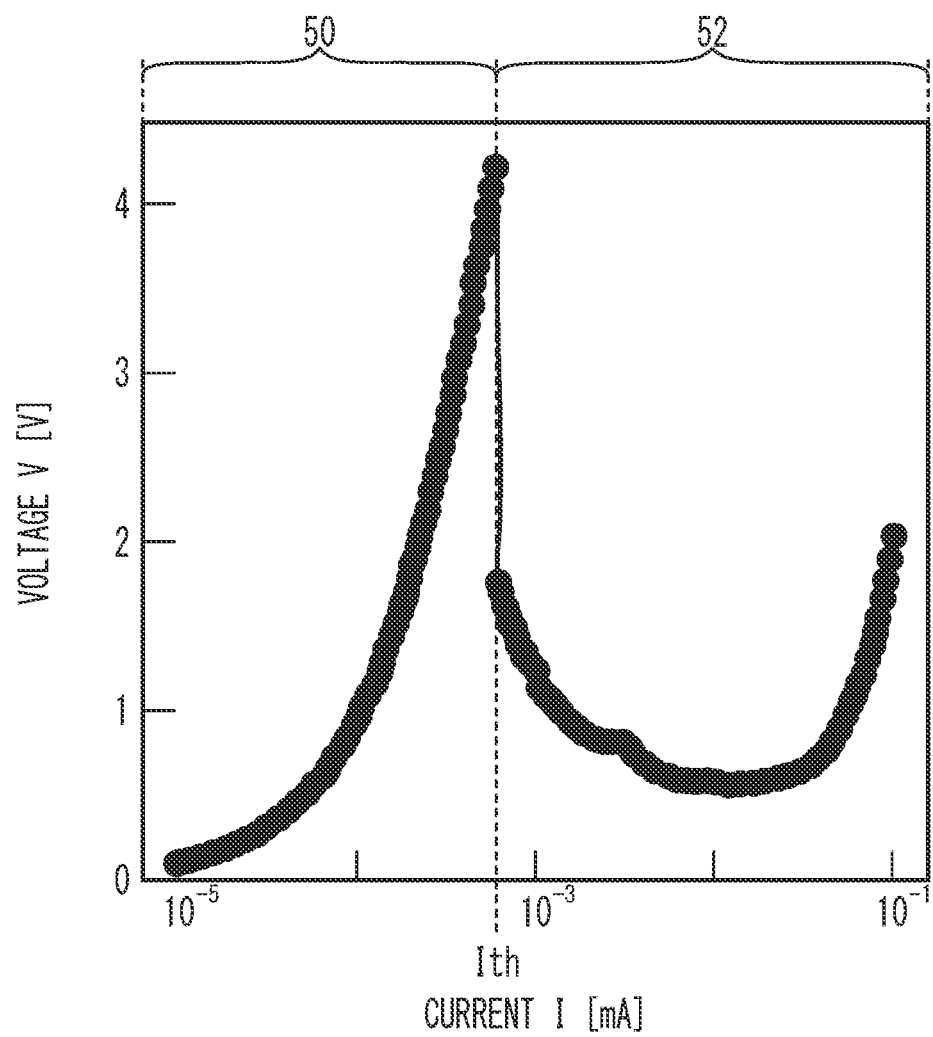
FIG. 3 is a graph of voltage versus current in a measured element.

FIG. 3 is a graph of voltage versus current in the measured element. The current I was increased, and the voltage V was measured. As presented in FIG. 3, in the range 50 of fine current where the current I is equal to or less than the threshold current Ith, the element 10 is in the high-resistance state, and as the current I increases, the voltage V increases. In the range 52 where the current I is equal to or greater than the threshold current Ith, the voltage V is low, and the element 10 is in the low-resistance state. As seen from the above, the same current-voltage characteristics as in FIG. 1C were obtained in the fabricated element 10. In addition, the threshold current Ith can be made to be 1 μA or less. The voltage V can be made to be several volts at a fine current at which the current I is 1 μA or less. The threshold current Ith and the value of the voltage V at the threshold current Ith can be adjusted by changing the length L and the width W of the active portion 14a described above.

Figure 4A:
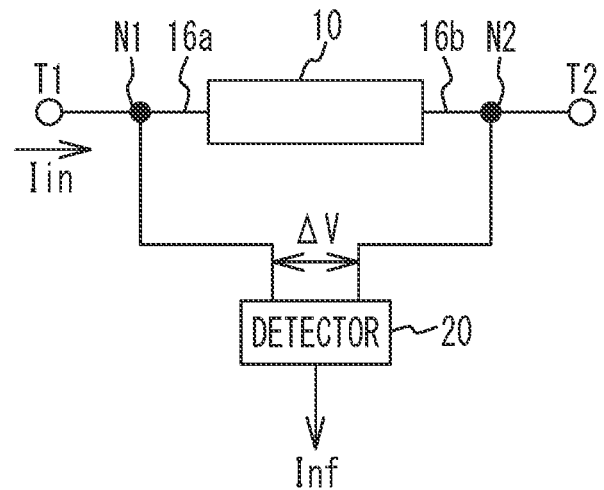
FIG. 4A and FIG. 4B are circuit diagrams of current sensors in accordance with the first embodiment.
Figure 4B:
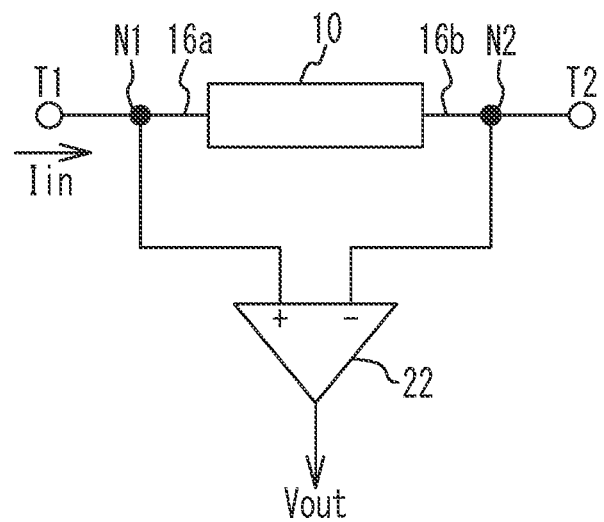

FIG. 4A and FIG. 4B are circuit diagrams of current sensors in accordance with the first embodiment. As illustrated in FIG. 4A, the element 10 is connected between terminals T1 and T2. Current Iin flows in the terminal T1. A detector 20 detects the current Iin based on the voltage of a node N1 between the electrode 16a of the element 10 and the terminal T1 and the voltage of a node N2 between the electrode 16b of the element 10 and the terminal T2. The detector 20 is, for example, a differential amplifier circuit, and outputs the voltage difference ΔV between the nodes N1 and N2 as information Inf about the current Iin. The voltage difference ΔV is substantially proportional to the current Iin.

As illustrated in FIG. 4B, the detector 20 may be a comparator 22. The comparator 22 outputs a high level when the voltage of the node N1 is higher than the voltage of the node N2, and outputs a low level when the voltage of the node N1 is lower than the voltage of the node N2.

Figure 5:
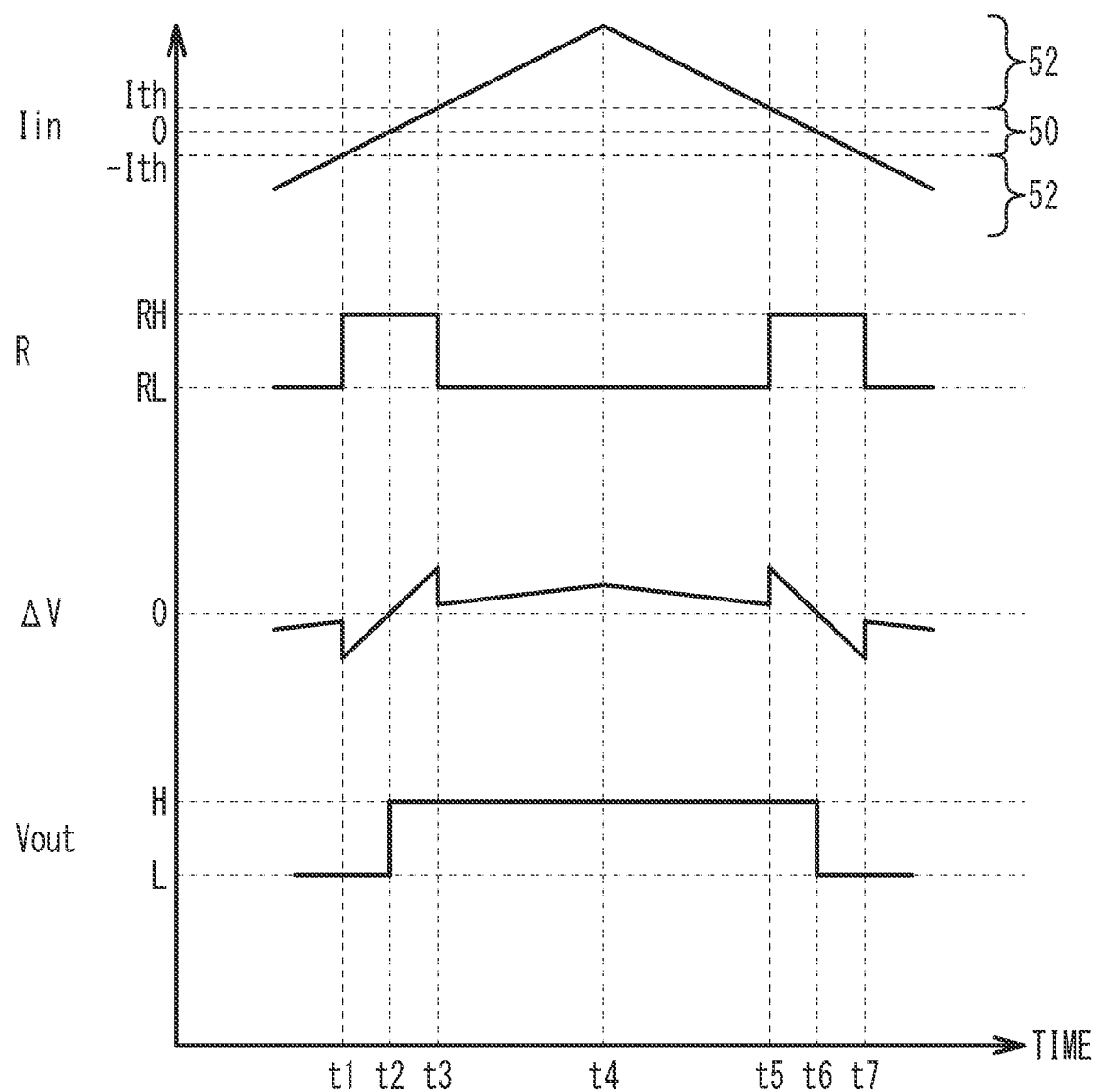
FIG. 5 is a timing chart of the current sensor in accordance with the first embodiment.

FIG. 5 is a timing chart of the current sensor in accordance with the first embodiment. The current Iin indicates the current value input to the terminal T1. The resistance state R indicates the low-resistance state RL and the high-resistance state RH of the element 10. The voltage difference ΔV indicates the input voltage difference of the detector 20 in FIG. 4A. The voltage Vout indicates the output of the comparator 22 in FIG. 4B. It is assumed that the threshold current Ith has no hysteresis, and it is assumed that the absolute value of the threshold current Ith when the current Iin is positive and the absolute value of the threshold current −Ith when the current Iin is negative are the same. The range between the threshold currents Ith and −Ith corresponds to the range 50, and the range of the threshold current Ith or greater and the range of the threshold current −Ith or less correspond to the range 52.

As presented in FIG. 5, before time t1, the current Iin is negative, less than the threshold current −Ith, the element 10 is in the low-resistance state RL, the voltage difference ΔV is negative, approximately equal to 0 V, and the voltage Vout is a low level. When the current Iin becomes the threshold current −Ith at time t1, the resistance state R switches to the high-resistance state RH. The voltage difference ΔV becomes the negative value corresponding to the current Iin. Since the voltage of the node N1 is lower than the voltage of the node N2, the voltage Vout maintains the low level.

As the current Iin increases in the period between time t1 and time t2, ΔV increases. The voltage Vout maintains the low level. At time t2, the current Iin becomes 0, and the voltage difference ΔV becomes 0. After time t2, the voltage Vout switches from the low level to a high level.

As the current Iin increases in the period between time t2 and time t3, the voltage difference ΔV increases, and the voltage Vout maintains the high level. When the current Iin becomes the threshold current Ith at time t3, the resistance state R switches to the low-resistance state RL. The voltage difference ΔV becomes a positive value approximately equal to 0 V. The voltage Vout maintains the high level.

At time t4, the current Iin switches from increasing to decreasing. In the period between time t3 and time t5, the current Iin is greater than the threshold current Ith, the resistance state R is the low-resistance state RL, the voltage difference ΔV is approximately 0 V (a small positive value), slightly increases with time in the period from time t3 to time t4, and slightly decreases with time in the period from time t4 to time t5.

At time t5, the current Iin becomes the threshold current Ith, at time t6, the current Iin becomes 0, and at time t7, the current Iin becomes the threshold current −Ith. In the period between time t5 and time t6, the resistance state R is the high-resistance state RH, the voltage difference ΔV is the positive value corresponding to the current Iin, and the voltage Vout is the high level. In the period between time t6 and time t7, the resistance state R is the high-resistance state RH, the voltage difference ΔV is the negative value corresponding to the current Iin, and the voltage Vout is the low level. At and after time t7, the resistance state R is the low-resistance state RL, the voltage difference ΔV is a negative value approximately equal to 0 V, and the voltage Vout maintains the low level.

The current sensor of the first embodiment senses the current Iin in the range 50 where the current Iin flowing through the element 10 is around 0. In the range 52, the element 10 enters the low-resistance state and does not sense the current.

First Comparative Example

Figure 6A:
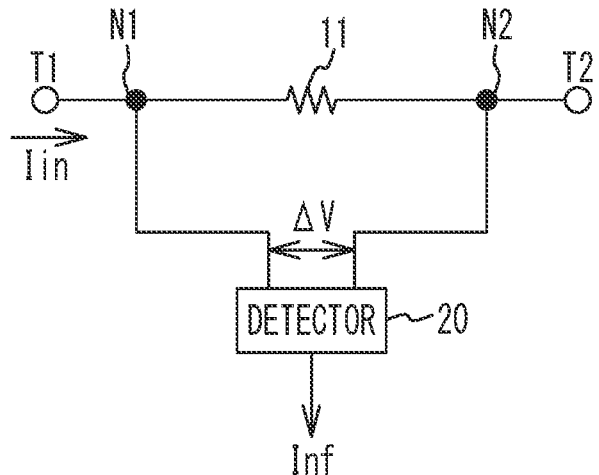
FIG. 6A is a circuit diagram of a current sensor in accordance with a first comparative example.

FIG. 6A is a circuit diagram of a current sensor in accordance with a first comparative example. As illustrated in FIG. 6A, the first comparative example is different from the element of the first embodiment illustrated in FIG. 4A in that a resistor 11 is connected between the terminals T1 and T2 instead of the element 10. Other structures are the same as those of the first embodiment, and the description thereof is thus omitted.

Figure 6B:
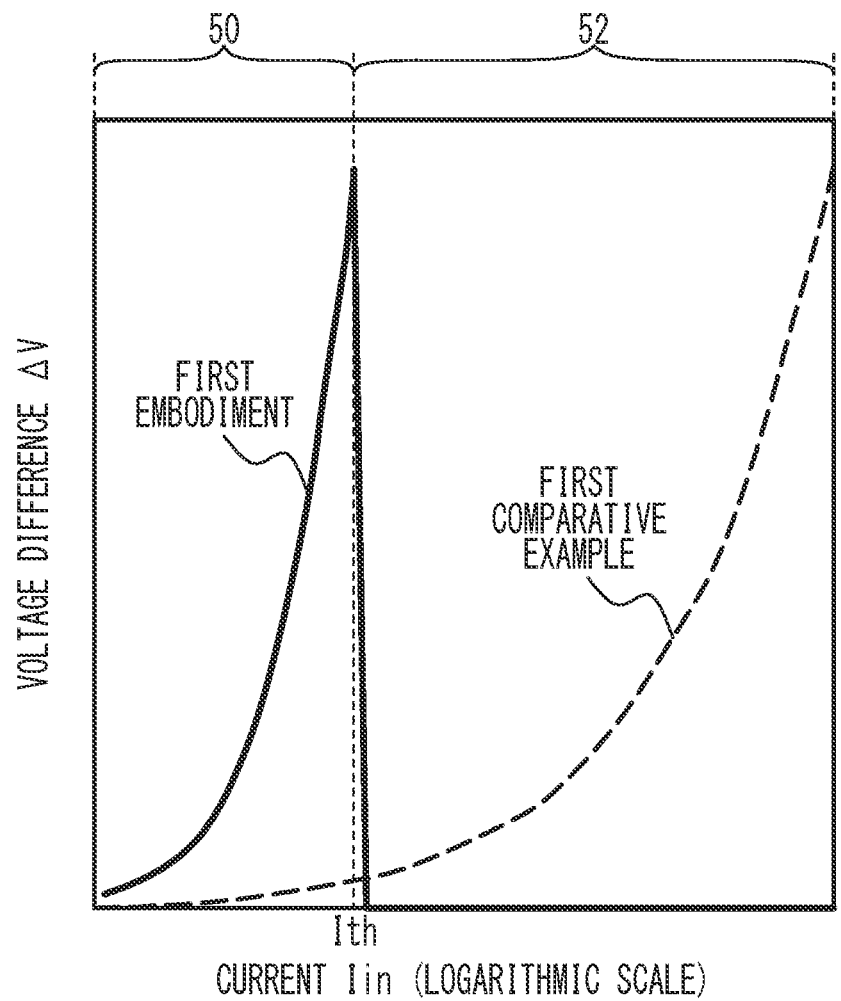
FIG. 6B is a schematic view illustrating voltage difference ΔV with respect to current Iin in the first embodiment and the first comparative example.

FIG. 6B schematically illustrates voltage difference with respect to current in the first embodiment and the first comparative example. As illustrated in FIG. 6B, in the first comparative example, the resistance value of the resistor 11 is set low. This is because in the case that the resistance value of the resistor 11 is high, the voltage drop due to the resistor 11 becomes large and the loss due to Joule heat or the like becomes large in the range 52 where the current Iin is large. However, in the range 50 where the current is small, the voltage difference ΔV between the nodes N1 and N2 is small. This decreases the detection accuracy of the detector 20. To increase the detection accuracy, it is conceivable to use an amplifier circuit that amplifies the voltage difference ΔV between the nodes N1 and N2. However, provision of the amplifier circuit increases the size and the cost of the current sensor. In addition, the power consumption of the current sensor increases.

In the case that a fine current is sensed but a large current is not required to be sensed, use of the current sensor of the first comparative example makes it difficult to achieve the improvement in detection accuracy of fine current and the reduction in loss in large current.

In the first embodiment, the circuit including the detector 20 or the comparator 22 supplies the current Iin to be measured to the element 10 to sense the value of the current Iin to be measured. When the absolute value of the current Iin (the current value) flowing between the electrode 16a (a first end) and the electrode 16b (a second end) is within the range 50 (a first range) where the absolute value of the current Iin is less than the threshold current Ith, the element 10 enters the high-resistance state without being controlled from the outside (e.g., an external circuit). For example, when the absolute value of the current Iin is the threshold current Ith or less, the element 10 enters the high-resistance state. This increases the voltage difference ΔV in the range 50. Therefore, the current Iin can be detected with high accuracy without using the amplifier circuit. For example, in FIG. 3, the voltage V is approximately 0.1 V at a current I of 10 nA, and the current can be detected with high accuracy. For example, the power consumption of the comparator 22 is generally smaller than that of the amplifier circuit. Therefore, the power consumption of the current sensor can be reduced.

When the absolute value of the current Iin is within the range 52 (a second range) greater than the range 50, the element 10 is in the low-resistance state in which the resistance value is lower than that in the high-resistance state without being controlled from the outside. In more detail, when the absolute value of the current Iin reaches the range 52 (the second range) exceeding the range 50, the element 10 changes to the low-resistance state in which the resistance value is lower than that in the high-resistance state. Therefore, in the range 52, the voltage drop due to the element 10 can be reduced, and the loss due to Joule heat or the like can be reduced. For example, in FIG. 3, when a current I of the threshold current Ith or greater flows, the voltage is about 1 V, and the loss can be reduced. The resistance value of the element 10 in the high-resistance state is preferably equal to or greater than 10 times, more preferably equal to or greater than 100 times the resistance value of the element 10 in the low-resistance state. In addition, unlike Patent Document 1, the current sensor can be miniaturized because it is not necessary to use a circuit for switching the resistance state.

First Variation of the First Embodiment

Figure 7A:
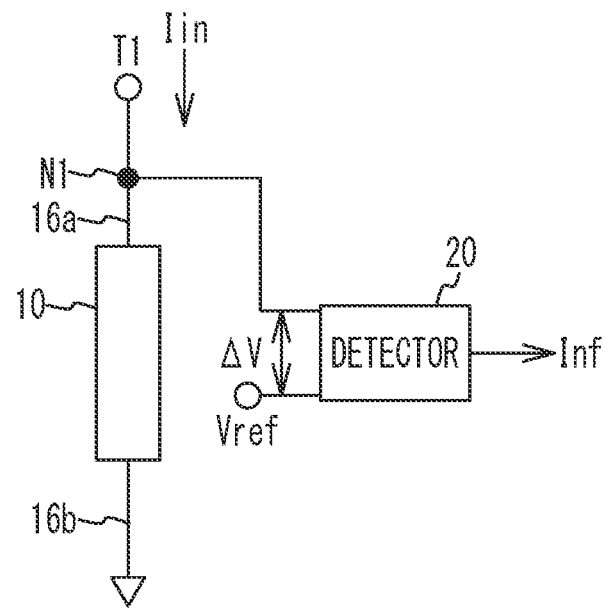
FIG. 7A and FIG. 7B are circuit diagrams of current sensors in accordance with a first variation of the first embodiment.
Figure 7B:
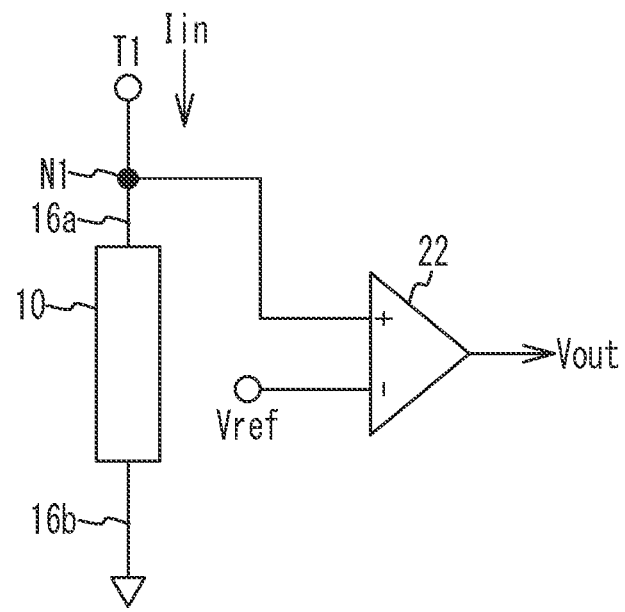

FIG. 7A and FIG. 7B are circuit diagrams of current sensors in accordance with a first variation of the first embodiment. As illustrated in FIG. 7A, the element 10 is connected between the terminal T1 and a ground. The current Iin flows in the terminal T1. The detector 20 detects the current Iin based on the voltage of the node N1 between the electrode 16a of the element 10 and the terminal T1 and the reference voltage Vref. The detector 20 is, for example, a differential amplifier circuit, and outputs the voltage difference ΔV between the voltage of the node N1 and the reference voltage Vref as the information Inf about the current Iin.

As illustrated in FIG. 7B, the detector 20 may be the comparator 22. The comparator 22 outputs a high level when the voltage of the node N1 is higher than the reference voltage Vref, and outputs a low level when the voltage of the node N1 is lower than the reference voltage Vref.

Figure 8:
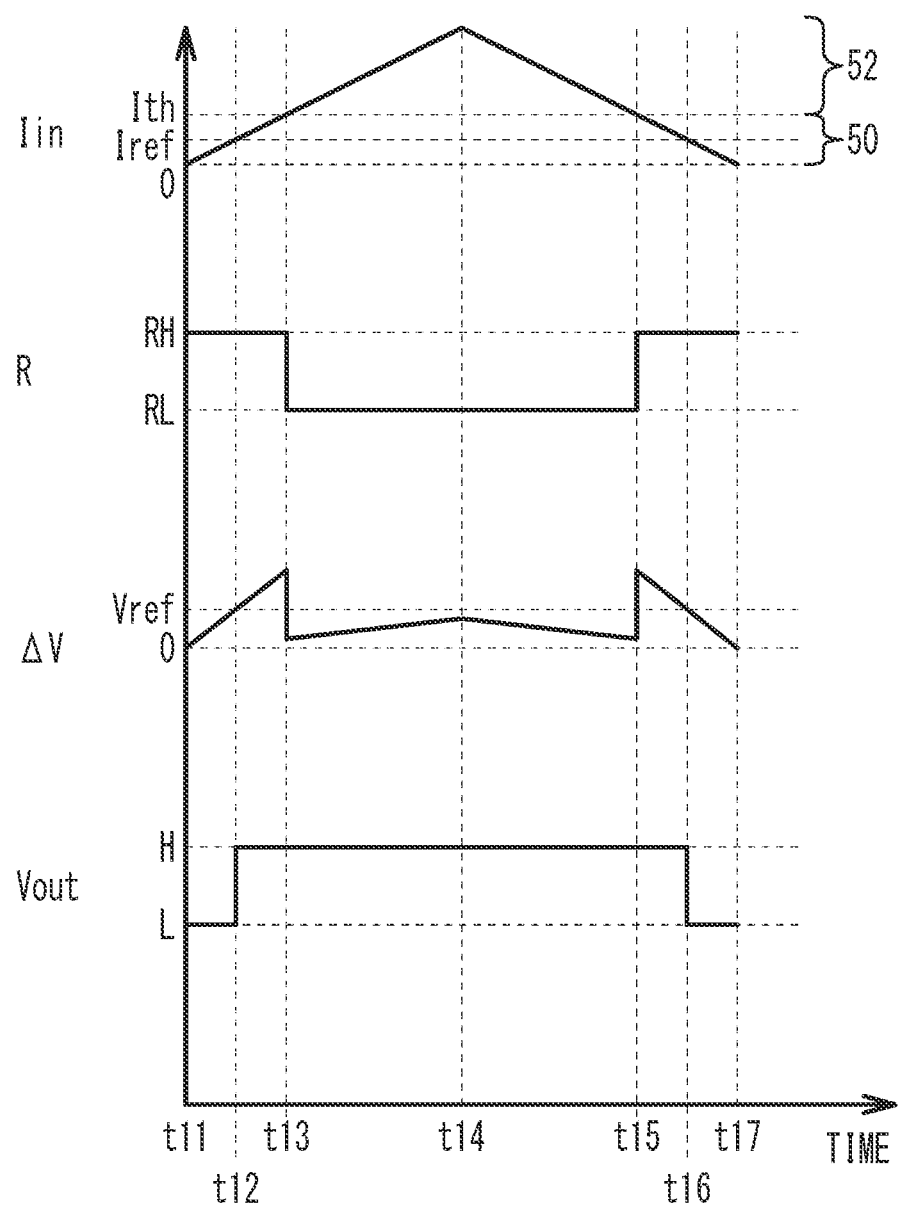
FIG. 8 is a timing chart of the current sensor in accordance with the first variation of the first embodiment.

FIG. 8 is a timing chart of the current sensor in accordance with the first variation of the first embodiment. The voltage difference ΔV indicates the output voltage of the detector 20 in FIG. 7A. The voltage Vout indicates the output of the comparator 22 in FIG. 7B. As presented in FIG. 8, at time t11, the current Iin is 0, the element 10 is in the high-resistance state RH, the voltage difference ΔV is substantially 0 V, and the voltage Vout is the low level. As the current Iin increases in the period between time t11 and time t12, the voltage difference ΔV increases. When the voltage difference ΔV becomes the reference voltage Vref at time t12, the voltage Vout becomes the high level. The current Iin at this time is a reference current Iref.

As the current Iin increases in the period between time t12 and time t13, the voltage difference ΔV increases. When the current Iin becomes the threshold current Ith at time t13, the resistance state R switches to the low-resistance state RL. The voltage difference ΔV becomes a positive value that is substantially 0 V. The voltage Vout maintains the high level.

At time t14, the current Iin switches from increasing to decreasing. In the period between time t13 and time t15, the current Iin is greater than the threshold current Ith, the resistance state R is the low-resistance state RL, and the voltage difference ΔV is substantially 0 V (a small positive value), slightly increases with time in the period from time t13 to time t14, and slightly decreases with time in the period from time t14 to time t15.

At time t15, the current Iin becomes the threshold current Ith, at time t16, the voltage difference ΔV becomes the reference voltage Vref, and at time t17, the current Iin becomes 0. In the period between time t15 and time t16, the resistance state R is the high-resistance state RH, the voltage difference ΔV is the value corresponding to the current Iin, and the voltage Vout is the high level. In the period between time t16 and time t17, the resistance state R is the high-resistance state RH, the voltage difference ΔV is the value corresponding to the current Iin, and the voltage Vout is the low level.

The current sensor of the first variation of the first embodiment senses the current Iin in the range 50 where the current Iin flowing through the element 10 is around 0. In the range 52, the element 10 enters the low-resistance state, and does not sense the current. Therefore, the current can be sensed with high accuracy in the range 50, while the loss is reduced in the range 52. Furthermore, in the current sensor illustrated in FIG. 7B, it can be determined whether the current Iin is the reference current Iref or greater or the reference current Iref or less.

As in the first embodiment, the detector 20 may sense the current Iin based on the voltage difference ΔV between the electrodes 16a and 16b. As in the first variation of the first embodiment, the detector 20 may sense the current Iin based on the voltage of the electrode 16a and the supplied reference voltage Vref. As seen from the above, the detector 20 senses the current Iin based on the voltage value of at least one of the electrodes 16a and 16b. In addition, sensing of the current Iin includes, for example, measuring of the current Iin and determining of whether the current Iin is a desired current value or greater or a desired current value or less.

Second Variation of the First Embodiment

Figure 9:
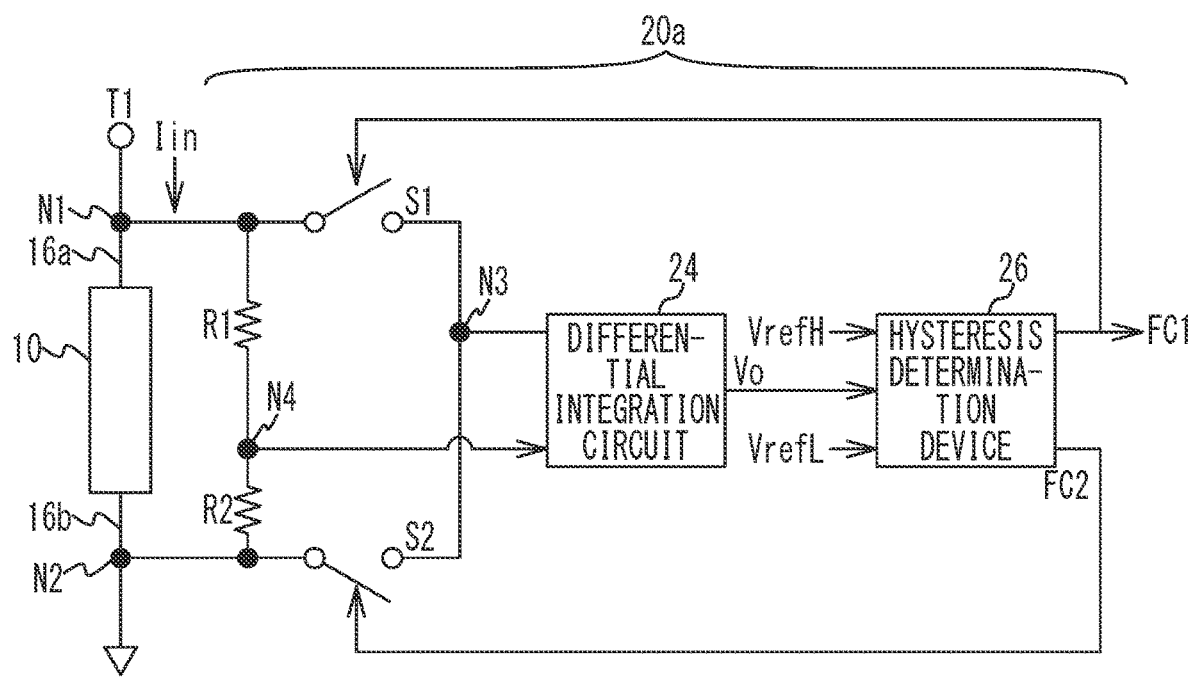
FIG. 9 is a circuit diagram of a current sensor in accordance with a second variation of the first embodiment.

A second variation of the first embodiment is an example of a current sensor that converts the current flowing through the element 10 into the period (frequency) of a pulse signal. FIG. 9 is a circuit diagram of a current sensor in accordance with the second variation of the first embodiment. As illustrated in FIG. 9, the element 10 is connected between the terminal T1 and a ground. The circuit described in Non-Patent Document 1 is used as a detector 20a. The detector 20a includes resistors R1 and R2, switches S1 and S2, a differential integration circuit 24, and a hysteresis determination device 26. The node N1 between the terminal T1 and the electrode 16a of the element 10 is coupled to a node N3 through the switch S1, and the node N2 between a ground and the electrode 16b of the element 10 is coupled to the node N3 through the switch S2. The resistors R1 and R2 are connected in parallel to the element 10 between the nodes N1 and N2. The voltage of a node N4 is the voltage obtained by dividing the voltage difference between the nodes N1 and N2 by the resistors R1 and R2.

The differential integration circuit 24 integrates the difference between the voltage of the node N3 and the voltage of the node N4, and outputs the voltage Vo.

The hysteresis determination device 26 sets control signals FC1 and FC2 at a low level and a high level, respectively, when the voltage Vo becomes the reference voltage VrefH or greater, and maintains the control signals FC1 and FC2 until the voltage Vo becomes the reference voltage VrefL or less. The hysteresis determination device 26 sets the control signals FC1 and FC2 at the high level and the low level, respectively, when the voltage Vo becomes the reference voltage VrefL or less, and maintains FC1 and FC2 until the voltage Vo becomes the reference voltage VrefH or greater. The control signals FC1 and FC2 are signals that control the switches S1 and S2, respectively. In the period during which the control signals FC1 and FC2 are at the high level, the switches S1 and S2 are ON, and in the period during which the control signals FC1 and FC2 are at the low level, the switches S1 and S2 are OFF.

Figure 10:
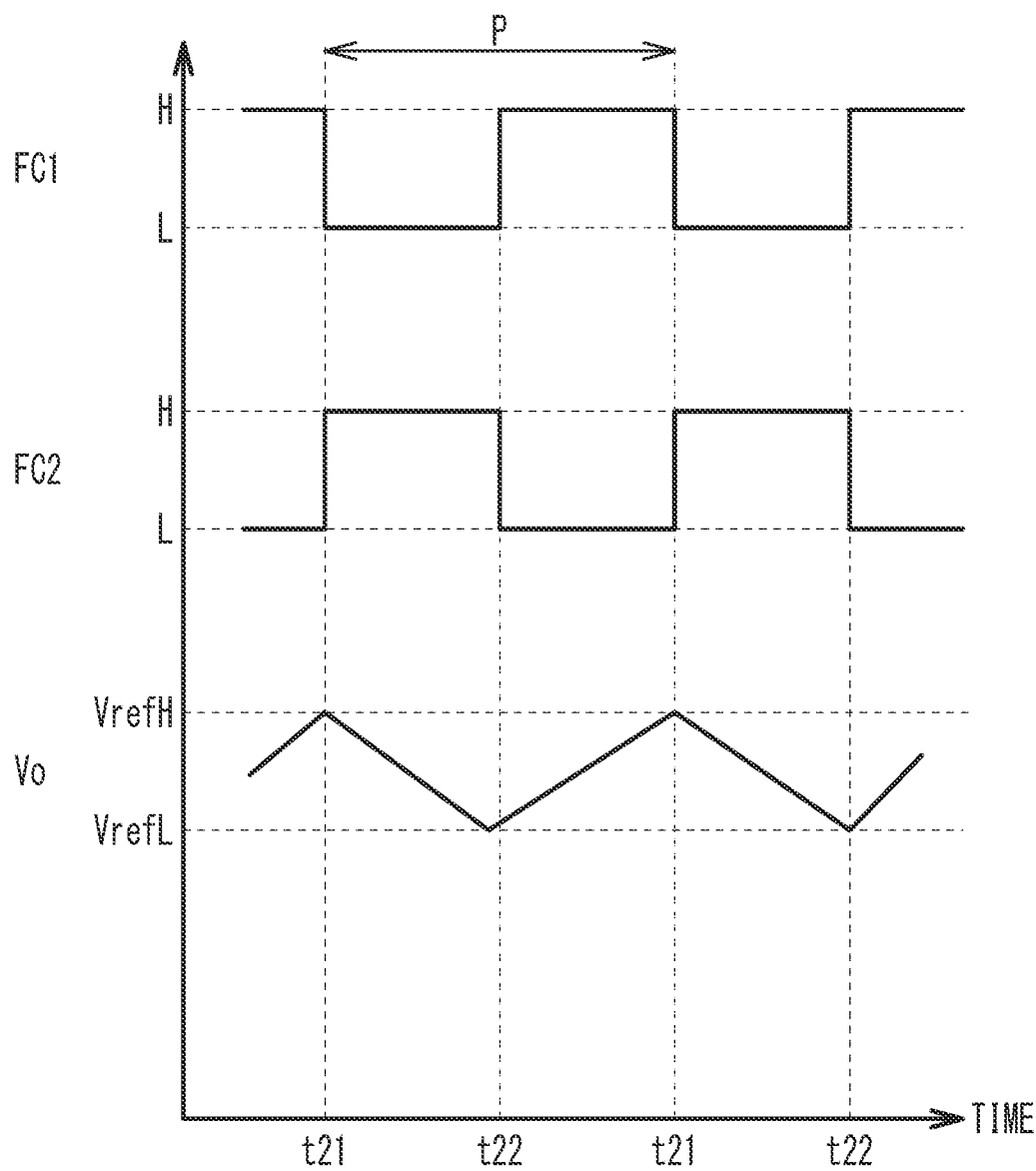
FIG. 10 is a timing chart of the current sensor in accordance with the second variation of the first embodiment.

A description will be given of the case that the current Iin is small and the element 10 is in the high-resistance state. FIG. 10 is a timing chart of the current sensor in the second variation of the first embodiment. Before time t21, the control signals FC1 and FC2 are at the high level and the low level, respectively, and the switches S1 and S2 are ON and OFF, respectively. The node N3 is connected to the node N1, but is disconnected from the node N2. As a result, the voltage difference between the nodes N3 and N4 becomes positive, and the voltage Vo increases.

When the voltage Vo becomes the reference voltage VrefH at time t21, FC1 and FC2 change to the low level and the high level, respectively. The switches S1 and S2 are turned OFF and ON, respectively. The node N3 is disconnected from the node N1 and is connected to the node N2. As a result, the voltage difference between the nodes N3 and N4 becomes negative, and the voltage Vo decreases.

When the voltage Vo becomes the reference voltage VrefL at time t22, FC1 and FC2 change to the high level and the low level, respectively, and the voltage Vo increases. Thereafter, the above is repeated.

When the voltage difference between the nodes N1 and N2 is small, the periods P of the control signals FC1 and FC2 become long, while when the voltage difference between the nodes N1 and N2 is large, the periods P of the control signals FC1 and FC2 become short. The detector 20a outputs the magnitude of the current Iin as the period (frequency) of the control signal FC1 when the element 10 is in the high-resistance state.

When the current Iin is equal to or greater than the threshold current Ith, the element 10 enters the low-resistance state. Therefore, the voltage difference between the nodes N1 and N2 becomes substantially 0 V, and the periods P of the control signals FC1 and FC2 become very long.

As seen from the above, in the range of fine current, the current can be converted into the period and output with high accuracy, while in the range of large current, the loss can be reduced. As in the second variation of the first embodiment, the detector 20a may output the current Iin as the information other than the voltage. Sensing of the current by the current sensor includes a case that the current Iin is output as the information other than the voltage.

The first embodiment and the variations thereof use the resistance element 14 that undergoes a phase transition such that when the temperature of the resistance element 14 is within a first temperature range, the element 10 enters the high-resistance state, and when the temperature of the resistance element 14 is within a second temperature range higher than the first temperature range, the element 10 enters the low-resistance state. Instead of vanadium dioxide ($VO_2$), niobium oxide ($NbO_2$) or titanium oxide ($Ti_2O_3$) may be used as such a resistance element 14. In vanadium dioxide, the phase transition temperature at which the high-resistance state and the low-resistance state switch is approximately 30° C. to 70° C. In niobium oxide, the phase transition temperature is approximately 840° C. In titanium oxide, the phase transition temperature is approximately 130° C. to 330° C. The resistance element 14 may be made of a material other than the aforementioned materials. In addition, impurities may be added to the aforementioned materials. For example, addition of W to $VO_2$ decreases the phase transition temperature, and addition of Al, Cr, or Ge increases the phase transition temperature. Addition of Ti little changes the phase transition temperature.

The resistance element 14 may switch between the high-resistance state and the low-resistance state by a mechanism other than the temperature phase transition. For example, the resistance element 14 may enter the low-resistance state when an electrochemical filament is formed between the electrodes, and enter the high-resistance state when the filament is cut. The resistance element 14 may be a copper compound, chalcogenide, tungsten oxide, or amorphous oxide. The current-voltage characteristics of the element 10 may have hysteresis, but when the absolute value of the current is 0, the element 10 enters the high-resistance state.

Second Embodiment

A second embodiment and variations thereof are examples in which the current sensor according to any one of the first embodiment and the variations thereof is used in a power conversion circuit. The second embodiment and a first variation thereof are exemplary synchronous rectifier circuits, and a second variation of the second embodiment is an exemplary step-down circuit (a DC-DC converter). For example, in an energy harvesting device such as vibration power generation that uses the vibration energy of a bridge to generate power, a small amount of power is generated. The current sensor used in the power conversion circuit that converts the power generated by such a generator is required to be able to detect fine currents. It is also required to reduce the loss due to the current sensor.

Figure 11:
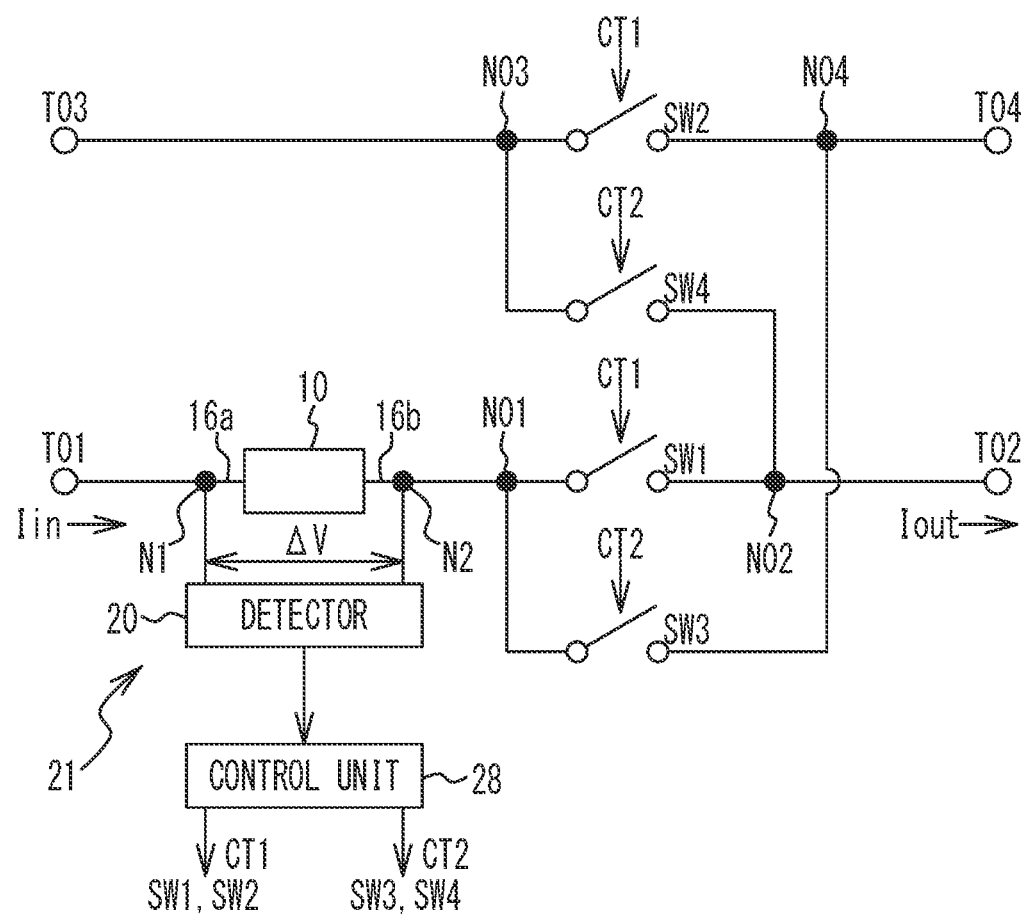
FIG. 11 is a circuit diagram illustrating a synchronous rectifier circuit in accordance with a second embodiment.

FIG. 11 is a circuit diagram of a synchronous rectifier circuit in accordance with the second embodiment. As illustrated in FIG. 11, a switch SW1 (a first switch element) is connected between terminals T01 (a first terminal) and T02 (a second terminal), a switch SW2 (a second switch element) is connected between terminals T03 (a third terminal) and T04 (a fourth terminal), a switch SW3 (a third switch element) is connected between the terminals T01 and T04, and a switch SW4 (a fourth switch element) is connected between the terminals T03 and T02. The switches SW1 and SW3 are connected at a node N01, the switches SW1 and SW4 are connected at a node N02, the switches SW2 and SW4 are connected at a node N03, and the switches SW2 and SW3 are connected at a node N04.

A current sensor 21 includes the element 10 and the detector 20. The element 10 is connected between the terminal T01 and the node N01. The node between the terminal T01 and the electrode 16a of the element 10 is the node N1, and the node between the node N01 and the electrode 16b of the element 10 is the node N2. The detector 20 outputs the voltage difference ΔV between the nodes N1 and N2. A control unit 28 outputs a control signal CT1 to the switches SW1 and SW2 and a control signal CT2 to the switches SW3 and SW4, based on the voltage difference ΔV.

Figure 12:
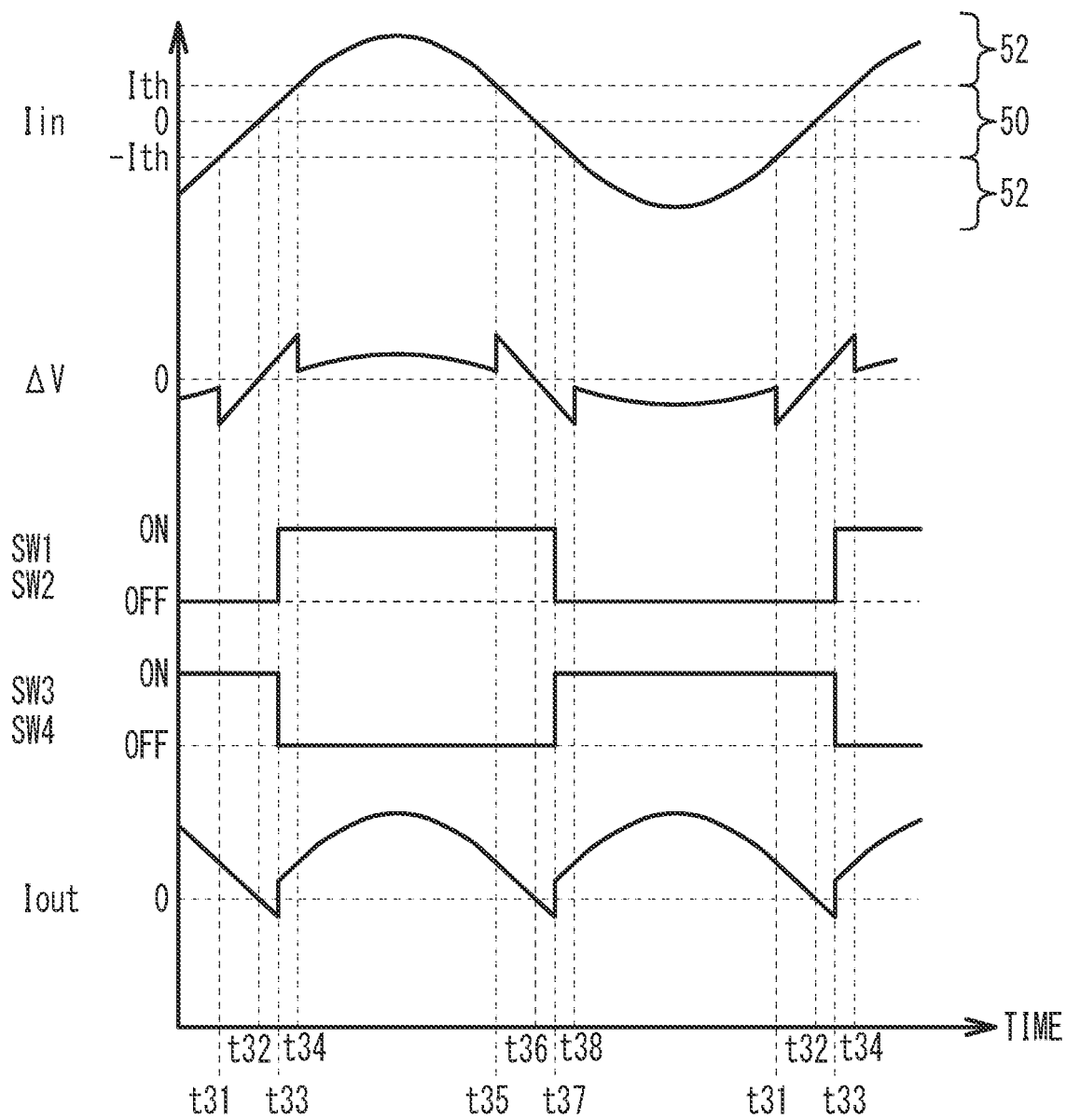
FIG. 12 is a timing chart of the synchronous rectifier circuit in accordance with the second embodiment.

FIG. 12 is a timing chart of the synchronous rectifier circuit in accordance with the second embodiment. The current input to the terminal T01 is represented by the current Iin, and the current output from the terminal T02 is represented by the current Iout. A current equal to the current Iin is output from the terminal T03, and a current equal to the current Iout is output to the terminal T04. Alternating current is input between the terminals T01 and T03, and a rectified current is output from between the terminals T02 and T04. The current Iin corresponds to the power generated by, for example, an energy harvesting device.

In energy harvesting, the waveform of the current is not always a trigonometric function, but in FIG. 12, the waveform of the current Iin is described as a trigonometric function for convenience. As presented in FIG. 12, before time t31, the current Iin is negative, and the current Iin is less than the threshold current −Ith. The element 10 is in the low-resistance state, and the voltage difference ΔV is substantially 0 V. The switches SW1 and SW2 are OFF, and the switches SW3 and SW4 are ON. The terminal T01 is connected to the terminal T04, while the terminal T03 is connected to the terminal T02. The current input to the terminal T01 is output from the terminal T04. The sign of the current Iout output from the terminal T02 is opposite to that of the current Iin, i.e., positive.

At time t31, the current Iin becomes larger than the threshold current −Ith. The element 10 enters the high-resistance state, and the voltage difference ΔV becomes the value corresponding to the current Iin. At time t32, the current Iin becomes 0. The voltage difference ΔV becomes 0V. The current Iout becomes substantially 0. At time t34, the current Iin becomes greater than the threshold current Ith. The element 10 enters the low-resistance state, and the voltage difference ΔV becomes substantially 0 V.

The control unit 28 determines that the voltage difference ΔV changes from negative to positive at some point between time t31 and time t34. In FIG. 12, the control unit 28 determines that the voltage difference ΔV changes from negative to positive at time t33, switches the switches SW1 and SW2 from OFF to ON, and switches the switches SW3 and SW4 from ON to OFF. The terminal T01 is connected to the terminal T02, and the terminal T03 is connected to the terminal T04. The current input to the terminal T01 is output from the terminal T02. The sign of the current Iout output from the terminal T02 becomes the same as that of the current Iin, i.e., positive.

In the period between time t34 and time t35, the current Iin is greater than the threshold current Ith. Therefore, the voltage difference ΔV is substantially 0 V (a small positive value), slightly increases with time, and slightly decreases with time thereafter. The switches SW1 and SW2 maintain an ON state, and the switches SW3 and SW4 maintain an OFF state. The current Iout is positive.

At time t35, the current Iin becomes less than the threshold current Ith. The element 10 enters the high-resistance state, and the voltage difference ΔV becomes the value corresponding to the current Iin. At time t36, the current Iin becomes 0, and at time t38, the current Iin becomes less than the threshold current −Ith. The element 10 enters the low-resistance state, and the voltage difference ΔV becomes substantially 0 V.

The control unit 28 determines that the voltage difference ΔV changes from positive to negative at some point between time t35 and time t38. In FIG. 12, the control unit 28 determines that the voltage difference ΔV changes from positive to negative at time t37, switches the switches SW1 and SW2 from ON to OFF, and switches the switches SW3 and SW4 from OFF to ON. The terminal T01 is connected to the terminal T04, and the terminal T03 is connected to the terminal T02. The current input to the terminal T01 is output from the terminal T04. The sign of the current Iout output from the terminal T04 becomes opposite to the sing of the current Iin, i.e., positive. As described above, the current Iin input from the terminal T01 is half-wave rectified, and is then output from the terminal T02.

In the second embodiment, the control unit 28 changes the switches SW1 and SW2 from OFF to ON and the switches SW3 and SW4 from ON to OFF based on the change of the current Iin from negative to positive, and changes the switches SW1 and SW2 from ON to OFF and the switches SW3 and SW4 from OFF to ON based on the change of the current Iin from positive to negative. As described above, switching of the sign of the current Iin is determined to switch the switches SW1 to SW4 so that the state where the current Iout is a positive value is substantially maintained. In other words, the control unit 28 and the switches SW1 to SW4 serve as a rectifier. The current sensor can sense the current Iin with high accuracy in the range 50 where the absolute value of the current Iin is small. In the range 52 where the absolute value of the current Iin is large, the element 10 enters the low-resistance state, and therefore, the loss due to the element 10 can be reduced.

First Variation of the Second Embodiment

Figure 13:
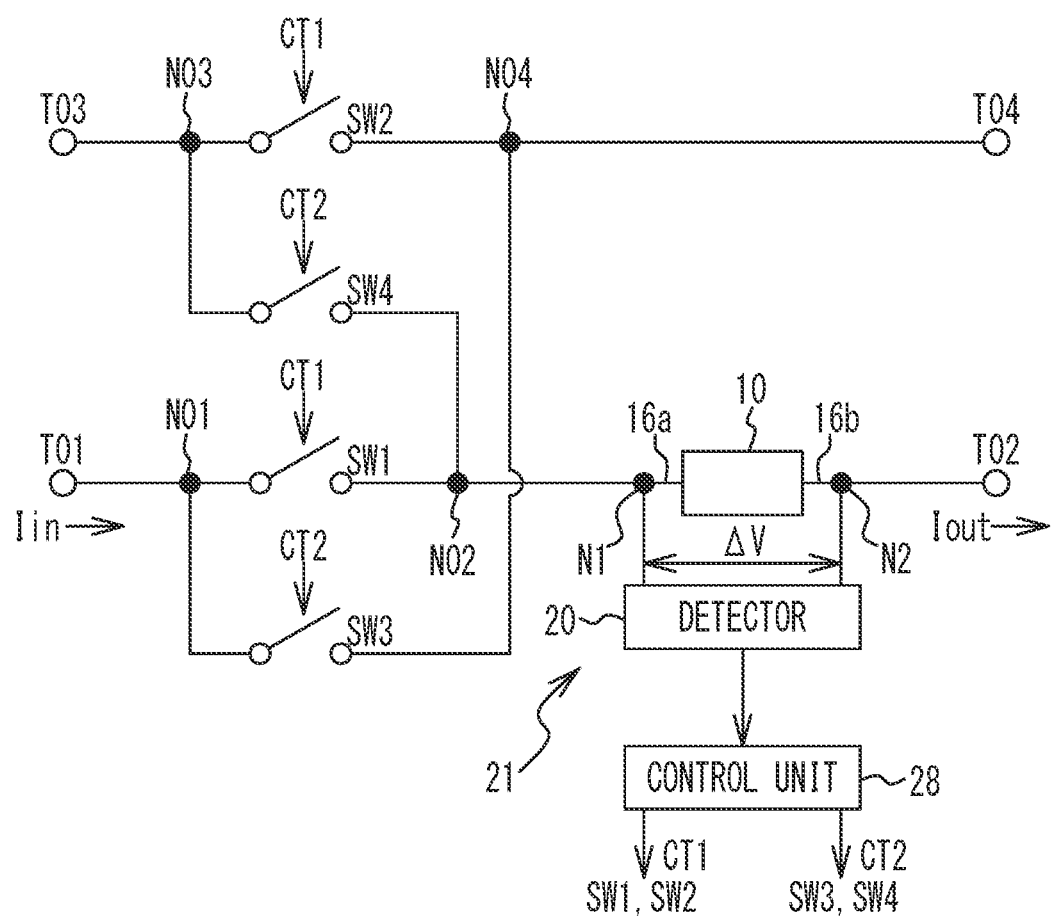
FIG. 13 is a circuit diagram of a synchronous rectifier circuit in accordance with a first variation of the second embodiment.

FIG. 13 is a circuit diagram of a synchronous rectifier circuit in accordance with a first variation of the second embodiment. As illustrated in FIG. 13, the current sensor 21 is connected between the node N02 and the terminal T02. In the second embodiment, the current sensor 21 senses the current Iin before rectified, while in the first variation of the second embodiment, the current sensor 21 senses the rectified current Iin. Other structures are the same as those of the second embodiment illustrated in FIG. 11, and the description thereof is thus omitted.

Figure 14:
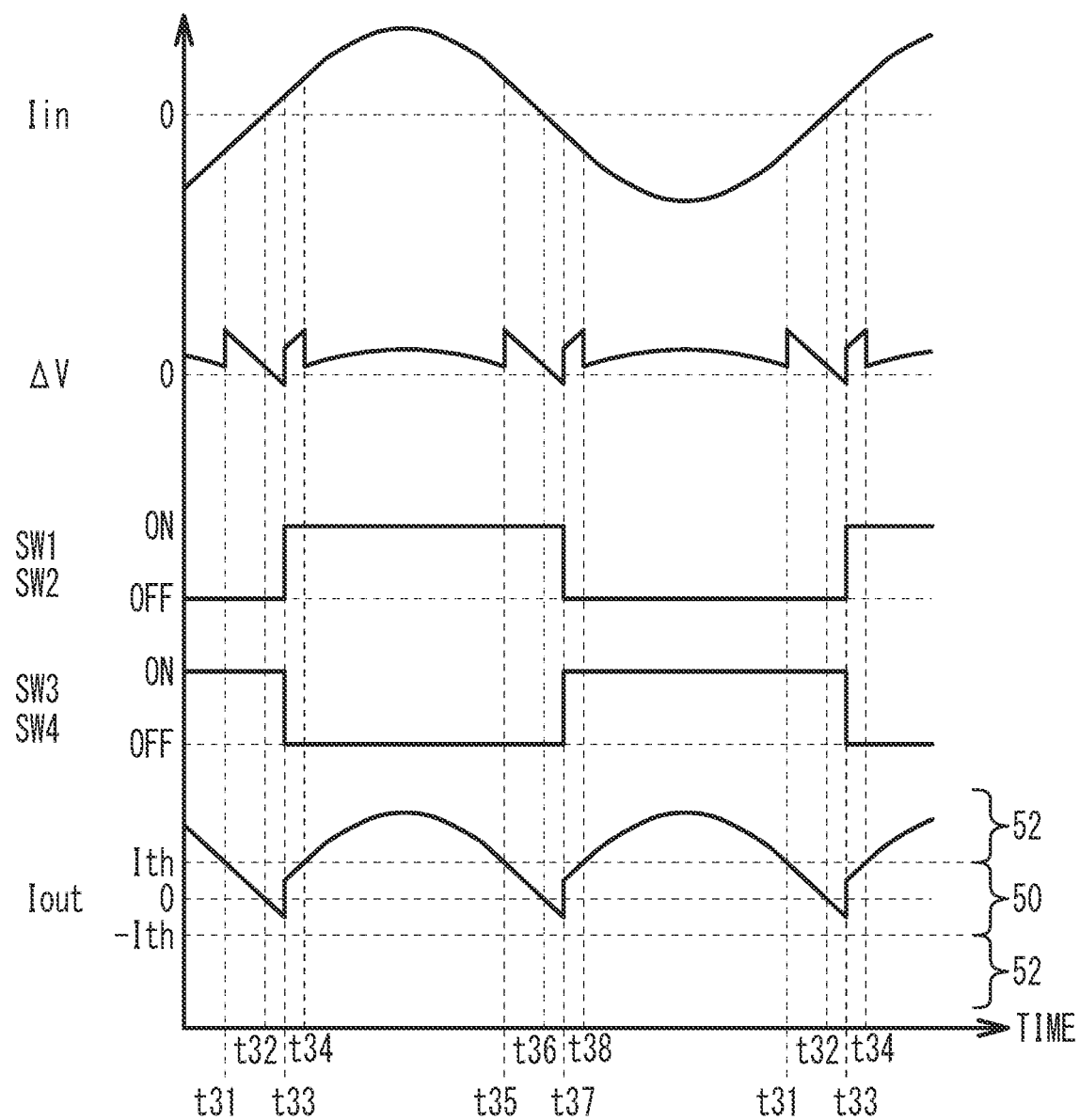
FIG. 14 is a timing chart of the synchronous rectifier circuit in accordance with the first variation of the second embodiment.

FIG. 14 is a timing chart of the synchronous rectifier circuit in accordance with the first variation of the second embodiment. As illustrated in FIG. 14, before time t31, the switches SW1 and SW2 are OFF, the switches SW3 and SW4 are ON, and the current Iout is opposite in sign to the current Iin. When the current Iout becomes the threshold current Ith at time t31, the element 10 enters the high-resistance state. The voltage difference ΔV becomes the positive value corresponding to the current Iout. At time t32, the current Iout becomes 0, and ΔV becomes 0. At time t33, the control unit 28 determines that the voltage difference ΔV changes from positive to negative, switches the switches SW1 and SW2 from OFF to ON, and switches the switches SW3 and SW4 from ON to OFF. As a result, the sign of the current Iout becomes the same as that of the current Iin, and the voltage difference ΔV changes from negative to positive. At time t34, the current Iout becomes the threshold current Ith, and the element 10 enters the low-resistance state.

The period from time t35 to time t38 is the same as the period from time t31 to time t34, and at time t37, the control unit 28 determines that the voltage difference ΔV changes from positive to negative, switches the switches SW1 and SW2 from ON to OFF, and switches the switches SW3 and SW4 from OFF to ON. As a result, the sign of the current Iout becomes opposite to that of the current Iin, and the voltage difference ΔV changes from negative to positive. Other timings are the same as those of the second embodiment illustrated in FIG. 12, and the description thereof is thus omitted.

In the first variation of the second embodiment, the current sensor 21 senses the rectified current Iout. In this case, the control unit 28 changes the switches SW1 and SW2 from OFF to ON and the switches SW3 and SW4 from ON to OFF based on the change of the current Iout from positive to negative, and changes the switches SW1 and SW2 from ON to OFF and the switches SW3 and SW4 from OFF to ON based on the next change of the current Iout from positive to negative. As seen from the above, switching of the sign of the current Iout is determined to switch the switches SW1 to SW4. This allows the current sensor 21 to sense the current Iout with high accuracy in the range 50 where the absolute value of the current Iout is small. In the range 52 where the absolute value of the current Iout is large, the element 10 enters the low-resistance state, and therefore, the loss due to the element 10 can be reduced.

As in the second embodiment and the first variation thereof, the element 10 is only required to be connected to one of the following locations: between the terminal T1 and the switches SW1 and SW3, and between the terminal T2 and the switches SW1 and SW4. In addition, the control unit 28 is only required to change the switches SW1 and SW2 from OFF to ON and the switches SW3 and SW4 from ON to OFF based on the change of the sign of the current Iin or Iout, and change the switches SW1 and SW2 from ON to OFF and the switches SW3 and SW4 from OFF to ON based on the next change of the sign of the current Iin or Iout.

Second Variation of the Second Embodiment

Figure 15A:
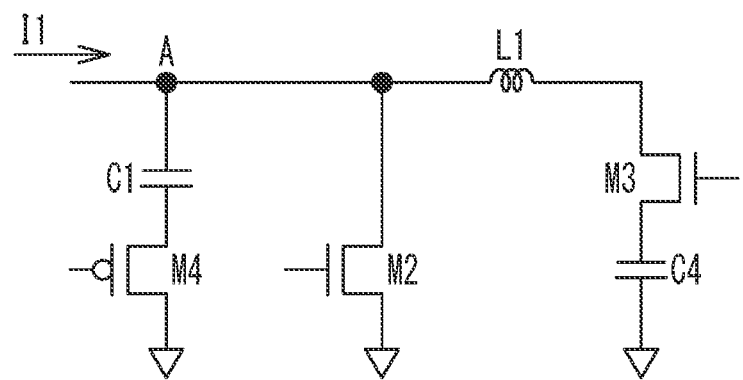
FIG. 15A to FIG. 15C schematically illustrate a step-down circuit in a second variation of the second embodiment.
Figure 15B:
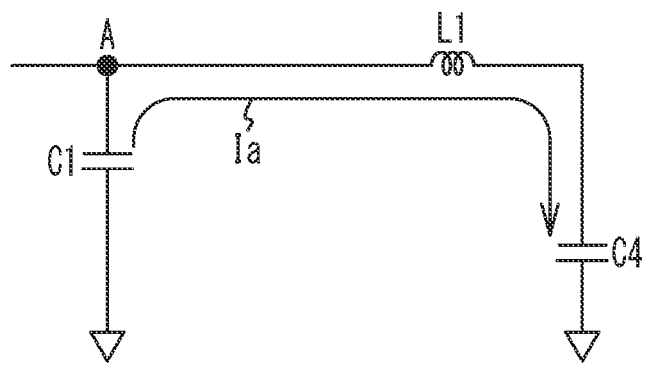
Figure 15C:
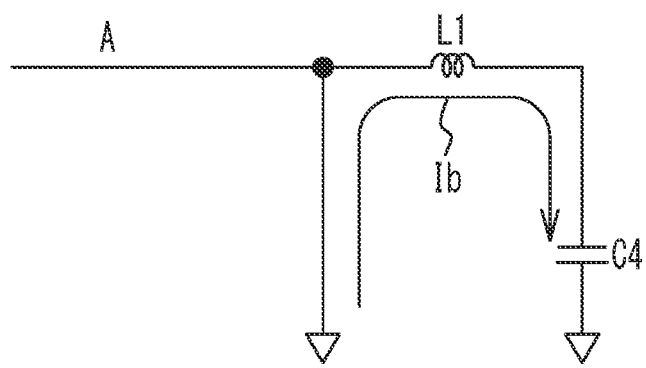

FIG. 15A to FIG. 15C are schematic views of a step-down circuit in accordance with the second variation of the second embodiment. As illustrated in FIG. 15A, current I1 is input to a node A. A capacitor C1 and a PFET (field effect transistor) M4 are connected between the node A and a ground. The capacitor C1 is a primary capacitor. The PFET M4 is a switch. An inductor L1 and a capacitor C4 are connected in series between the node A and a ground. The capacitor C4 is a secondary capacitor. An NFET M3 is connected between the inductor L1 and the capacitor C4 as a switch. An NFET M2 is connected between the node between the capacitor C1 and the inductor L1 and a ground as a switch.

The capacitance values of the capacitors C1 and C4 are adjusted to be 100 pF and 10 nF, respectively, and the inductance of the inductor L1 is adjusted to be 0.3 nH. These values are set so that the voltage drop of the on-resistance (e.g., 10 kΩ) of the NFET M4 can be ignored. These values can be freely set.

During the operation of the step-down circuit, the NFET M3 is ON, the PFET M4 is ON, and the NFET M2 is OFF. As a result, as illustrated in FIG. 15B, the electric charge accumulated in the capacitor C1 passes through the inductor L1 as current Ia, and charges the capacitor C4. At this time, the magnetic flux energy is stored in the inductor L1.

When the electric charge in the capacitor C1 becomes low, the PFET M4 turns OFF and the NFET M2 turns ON. As illustrated in FIG. 15C, the magnetic flux energy of the inductor L1 causes current Ib to flow and be stored in the capacitor C4. As a result, the magnetic flux energy of the inductor L1 is recovered to the capacitor C4.

For example, when the voltages for charging the capacitors C1 and C4 are set at 10 V and 1 V, respectively, the electric charge that is 10 times the electric charge transferring from the capacitor C1 is stored in the capacitor C4. In FIG. 15B, part of the electric charge stored in the capacitor C1 charges the capacitor C4. At this time, the energy is stored as the magnetic flux energy of the inductor L1. In FIG. 15C, the energy stored as the magnetic flux energy is converted into the current Ib to charge the capacitor C4. This allows the electric charge that is approximately 10 times the electric charge transferring from the capacitor C1 to be stored in the capacitor C4.

FIG. 16A is a circuit diagram of the step-down circuit in the second variation of the second embodiment, and FIG. 16B illustrates a flip-flop circuit. In the step-down circuit of the second variation of the second embodiment, the current sensor 21 is connected between the NFET M2 and a ground and senses the current flowing through the NFET M2. The current sensor 21 includes the element 10 and the comparator 22.

A description will be given of the operations of flip-flop (FF) circuits X1 to X4 in FIG. 16A. As illustrated in FIG. 16B, a flip-flop (FF) circuit 25 includes input terminals 25a and 25b, and output terminals 25c and 25d. When a high-level signal is input to the input terminal 25a, the FF circuit 25 outputs a low level to the output terminal 25c and outputs a high level to the output terminal 25d. Then, the FF circuit 25 maintains the output terminal 25c at the low level and the output terminal 25d at the high level until the next high-level signal is input to the input terminal 25b. When a high-level signal is input to the input terminal 25b, the FF circuit 25 outputs the high level to the output terminal 25c and the low level to the output terminal 25d, and maintains the output terminal 25c at the high level and the output terminal 25d at the low level until the next high-level signal is input to the input terminal 25a.

A spike generation circuit X5 in FIG. 16A outputs a positive spike signal to the FF circuit X1 and the FF circuit X4 through a node B when the voltage of the node A becomes 8 V or greater. A spike generation circuit X8 outputs a positive spike signal to a node E after 1 μsec when a node C enters a high level. The voltage of the node A at which the spike generation circuit X5 outputs a spike signal and the time at which the spike generation circuit X8 outputs a spike signal to the node E after the node C enters the high level can be freely set.

Figure 17:
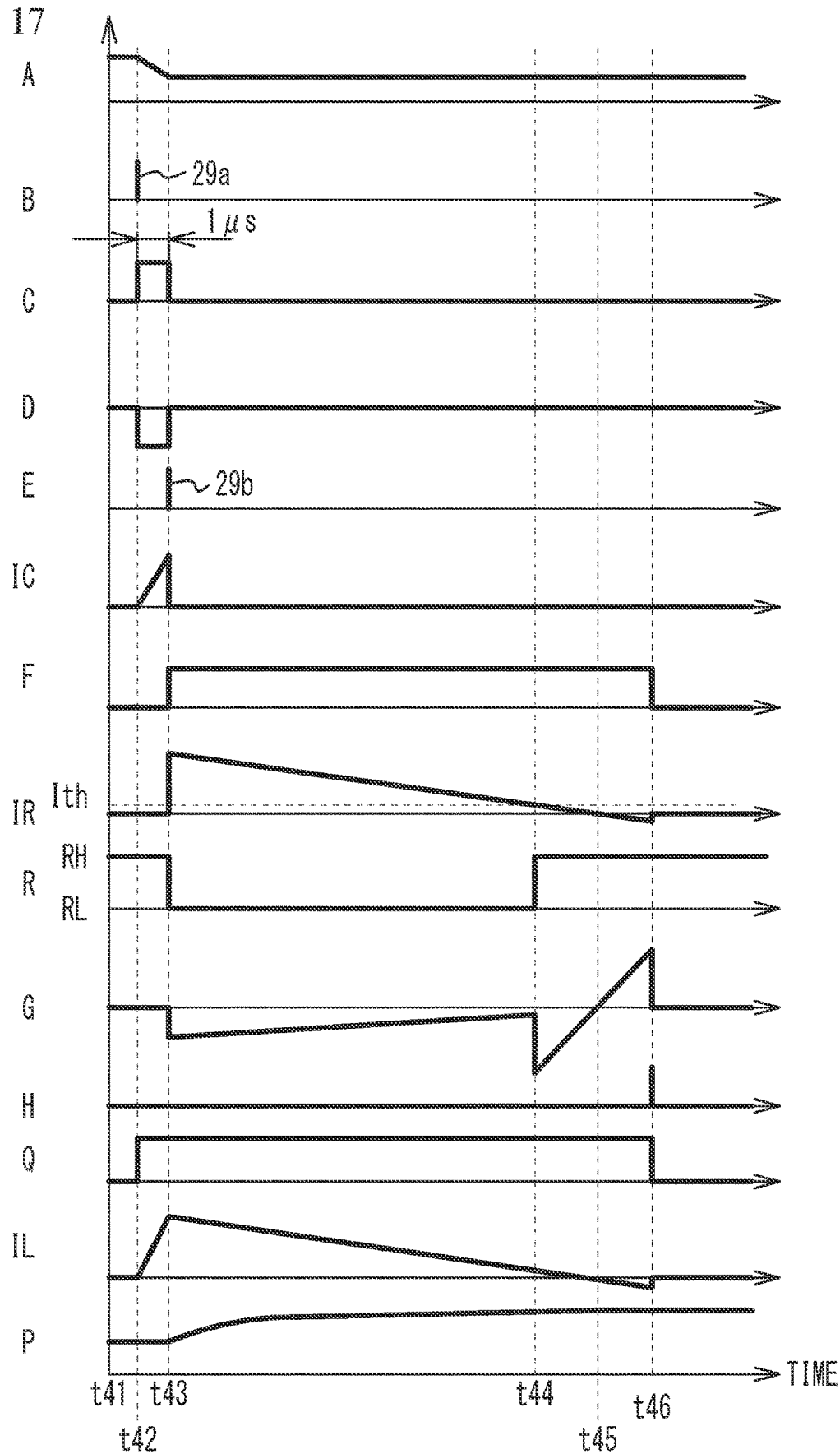
FIG. 17 is a timing chart of the voltage and the current of each node of the step-down circuit in the second variation of the second embodiment.

FIG. 17 is a timing chart of the voltage and the current of each node of the step-down circuit in the second variation of the second embodiment. The node A corresponds to the input voltage to the step-down circuit, and a node P corresponds to the output voltage of the step-down circuit. As illustrated in FIG. 16A and FIG. 17, the current I1 is supplied from a current supply X6 to the node A. The current supply X6 is a power generator such as, for example, an energy harvesting device. In the period between time t41 and time t42, since the current I1 flows into the node A, the voltage of the node A gradually increases from 7 V to 8 V. Since the increase rate of the voltage of the node A is small, the voltage of the node A appears to be constant in the period between time t41 and time t42 in FIG. 17. Before time t42, the voltage of the node A has not reached 8 V. During this period, the node B is at the low level. The FF circuit X4 maintains the node Q at the low level. When the node Q is at the low level, the NFET M3 is OFF, and when the node Q is at the high level, the NFET M3 is ON. Thus, in the period between time t41 and time t42, the NFET M3 is OFF. The current IL passing through the inductor L1 in the right direction is 0. The current I1 charges the capacitor C1, and the voltage of the node A increases.

The operation of the NFET M3 will be described. The threshold voltages of the NFETs M3 and M7 are set at 0.4 V. The NFET M7 serves as a diode of which the forward direction is the direction from the node Q to the node P. When the node Q is at the low level, the voltage of the gate of the NFET M3 is lower than the voltage of the node P, which is a first end of the capacitor C4, by approximately −0.3 V, which corresponds to the turn-on voltage of the diode. Therefore, the NFET M3 is OFF.

The voltage of the node A increases, and when the voltage of the node A exceeds 8 V at time t42, the spike generation circuit X5 outputs a spike signal 29a to the node B. The FF circuit X4 outputs a high level to the node Q. The voltage of the gate of the NFET M3 becomes higher than the voltage of the node P by approximately +0.7 V, and the NFET M3 turns ON. As a result, the current IL starts flowing in the inductor L1.

Further, at time t42, the spike signal 29a is input to the FF circuit X1 from the node B. The FF circuit X1 outputs the high level to the node C, and outputs the low level to a first end of the capacitor C2. The spike generation circuit X8 outputs a spike signal 29b to the node E at time t43, which is 1 μsec after time t42 at which the node C enters the high level. This causes the FF circuit X1 to output the low level to the node C and the high level to the first end of the capacitor C2 at time t43. As a result, the node C is at the high level during a period of 1 μs between time t42 and time t43, and is at the low level during other periods.

A node D is coupled to a ground through an NFET M6 serving as a diode.

The voltage of the node D is a negative voltage in the period between time t42 and time t43, and is 0 V in other periods (including the period after time t43). As a result, the PFET M4 of which the gate is coupled to the node D is ON in the period between time t42 and time t43. Since the NFET M3 maintains ON, the connection relationship illustrated in FIG. 15B is established. Part of the electric charge stored in the capacitor C1 flows in the node A as current IC. The current IC becomes the current IL passing through the inductor L1 to charge the capacitor C4. The voltage of the node A decreases. The magnetic flux energy is stored in the inductor L1.

Before time t43, a node F is at the low level, and the NFET M2 is OFF. The current IR flowing through the element 10 is 0, and the resistance state R of the element 10 is the high-resistance state RH. Since the voltage difference between the nodes N1 and N2 is substantially 0 V, the voltage of a node G is substantially 0 V. The comparator 22 outputs the low level to a node H.

At time t43, when the spike signal 29b is input to the FF circuit X3 from the node E, the FF circuit X3 puts the node F at the high level. The NFET M2 turns ON. As described above, at time t43, the PFET M4 turns OFF. As a result, the connection relationship illustrated in FIG. 15C is established. The current IR flows in the node A from a ground. The current IR is greater than the threshold current Ith. Thus, the resistance state R becomes the low-resistance state RL. The voltage difference between the nodes N1 and N2 is very small, and the voltage of the node G is a small negative value. The comparator 22 maintains the node H at the low level.

After time t43, the current IR and the current IL flow from the magnetic flux energy stored in the inductor L1 to charge the capacitor C4. As a result, the voltage of the node P increases. The currents IL and IR of the inductor L1 decrease with time. The voltage of the node G becomes closer to 0 V with time.

When the current IR of the element 10 becomes the threshold current Ith at time t44, the resistance state R of the element 10 becomes the high-resistance state RH. The voltage difference ΔV between the nodes N1 and N2 becomes negative, and the voltage of the node G becomes negative. Since the voltage of the node G is negative, the comparator 22 maintains the node H at the low level.

At time t45, when the current IR of the element 10 becomes 0, the voltage of the node G becomes 0 V. Thereafter, the current IL becomes negative, and the current IR becomes negative. After time t45, the voltage of the node P switches from increasing to decreasing. At time t46, the comparator 22 determines that the voltage of the node G becomes higher than 0 V, and puts the node H at the high level. The FF circuit X4 puts the node Q at the low level. As a result, the NFET M3 turns OFF. The FF circuit X3 puts the node F at the low level. As a result, the NFET M2 turns OFF. The currents IL and IR become 0. Since the voltage of the node G becomes 0 V, the node H returns to the low level. This completes the step-down operation.

In the second variation of the second embodiment, the element 10 is in the high-resistance state RH when the absolute value of the current IR is small as in the period from time t44 to time t46, and the comparator 22 can determine that the current IR becomes substantially 0 accurately. Since the element 10 is in the low-resistance state RL when the absolute value of the current IR is large as in the period from time t43 to time t44, the resistance loss due to the element 10 can be reduced.

In the second embodiment and the first variation thereof, the control unit 28 controls turning on and off of the switches SW1 to SW4 based on the output of the current sensor 21. In the second variation of the second embodiment, the FF circuits X3 and X4 (a control unit) control the NFETs M2 and M3 (a switch element) based on the output of the current sensor 21. This allows the current sensor 21 to sense a fine current flowing through the element 10 accurately, and reduces the loss when the current flowing through the element 10 is large.

In the second embodiment and the variations thereof, the synchronous rectifier circuits and the step-down circuit are described as the power conversion circuit using the current sensor in accordance with any one of the first embodiment and the variations thereof, but the power conversion circuit may be step-down circuits having other circuit configurations, step-up circuits, DC-AC power conversion circuits, or AC-DC power conversion circuits. In the power conversion circuit, a control that senses the current to switch the switch element is conducted. Current sensing is often performed in the range where the absolute value of the current is small. Therefore, use of the current sensor according to any one of the first embodiment and the variations thereof enables to sense a fine current accurately and reduce the loss in the range of large current. The current sensors of the first embodiment and the variations thereof can be used in electric circuits other than the power conversion circuit and electronic circuits.

[Manufacturing Method of the Element 10]

Figure 18A:
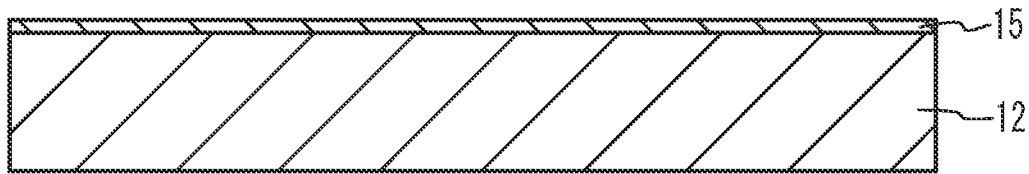
FIG. 18A to FIG. 18D are cross-sectional views illustrating a method of manufacturing the elements illustrated in FIG. 2A and FIG. 2B.

A description will be given of a manufacturing method of the elements 10 in FIG. 2A and FIG. 2B used in the first and second embodiments and the variations thereof. FIG. 18A to FIG. 18D are cross-sectional views illustrating the manufacturing method of the elements illustrated in FIG. 2A and FIG. 2B. As illustrated in FIG. 18A, the thin film 15 is formed on the substrate 12. The substrate 12 is, for example, a monocrystalline $TiO_2$ substrate, and the thin film 15 is, for example, a $VO_2$ film. The $VO_2$ film is formed using sputtering or pulse laser deposition techniques. The film is formed under the condition that the temperature of the substrate 12 is 300° C. and the oxygen partial pressure is 1 Pa, for example.

Figure 18B:
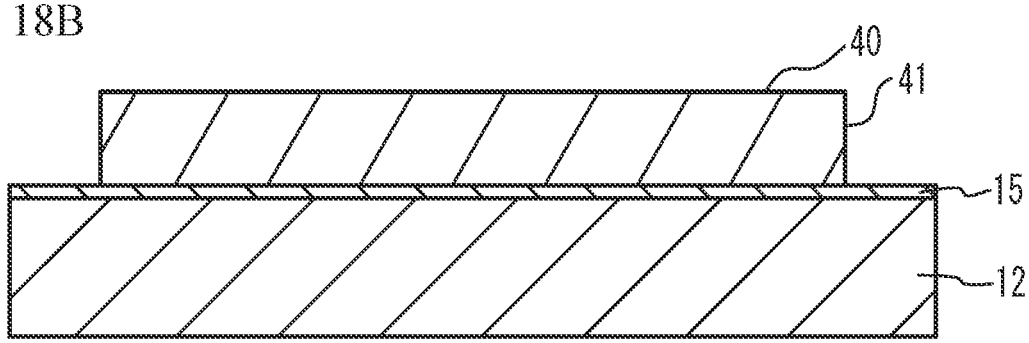

As illustrated in FIG. 18B, a mask layer 40 having apertures 41 is formed on the thin film 15. The mask layer 40 is, for example, photoresist. By applying the photoresist and exposing and developing it, the mask layer 40 having the apertures 41 is formed.

Figure 18C:
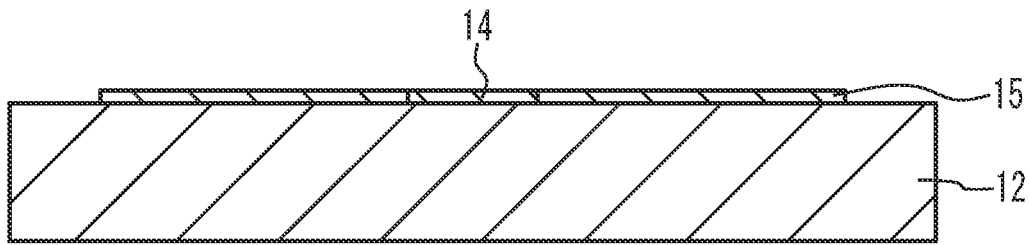

As illustrated in FIG. 18C, the thin film 15 is removed using the mask layer 40 as a mask. The thin film 15 is removed using, for example, wet etching or dry etching techniques. By removing the mask layer 40, the thin film 15 is patterned and the resistance element 14 is formed.

Figure 18D:
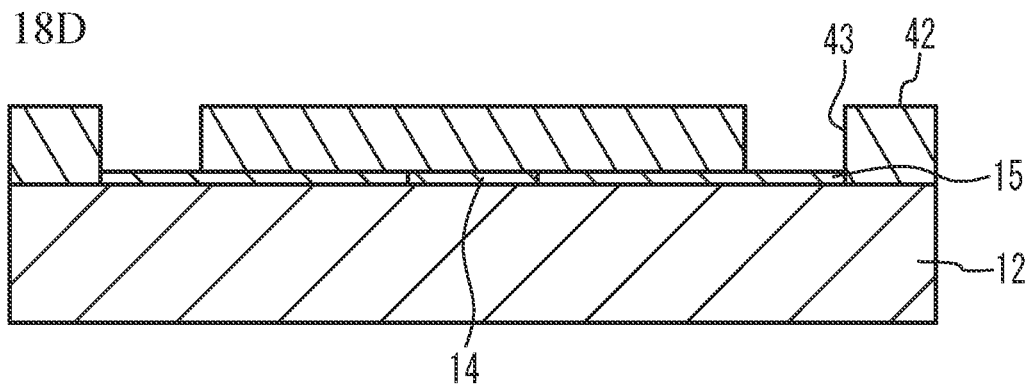

As illustrated in FIG. 18D, a mask layer 42 having apertures 43 is formed on the substrate 12 and the resistance element 14. The mask layer 42 is, for example, photoresist. By applying the photoresist and exposing and developing it, the mask layer 42 having the apertures 43 is formed. Thereafter, a metal film to be the electrodes is formed using, for example, vacuum evaporation techniques. By removing the mask layer 42, the metal film on the mask layer 42 is lifted off. This forms the electrodes 16a and 16b in FIG. 2B.

Third Embodiment

A third embodiment is an example in which a PN-Body Tied SOI-FET described in S. Momose et. Al. "Gate Controlled Diode Characteristics of Super Steep Subthreshold Slope PN-Body Tied SOI-FET for High Efficiency RF Energy Harvesting" 2017 IEEE SOI-3D-Subthreshold Microelectronics Technology Unified Conference is used as the element 10 used in the first embodiment and the variations thereof.

Figure 19:
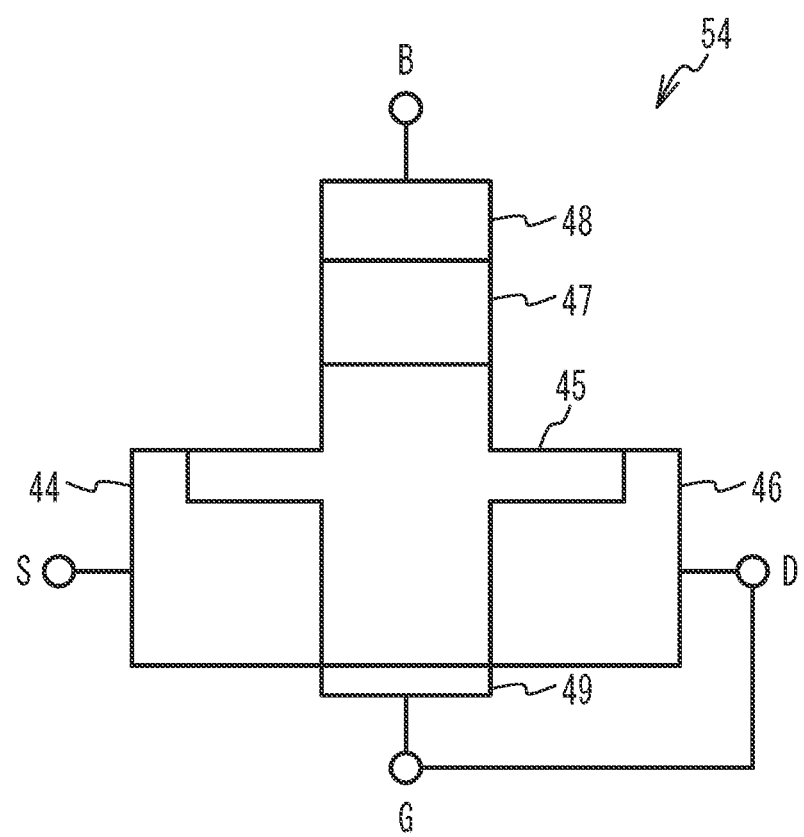
FIG. 19 is a plan view illustrating a transistor used in a third embodiment.

FIG. 19 is a plan view of a transistor used in the third embodiment. A transistor 54 is formed on a semiconductor on insulator (SOI) substrate. Sections 44 to 48 are formed in a semiconductor layer (e.g., a silicon layer) formed on the insulating layer of the SOI. The sections 44 (a first semiconductor section) and 46 (a second semiconductor section) are $n^+$ sections (a first conductive type section), the section 45 (a third semiconductor section) is a $p^-$ section (a second conductive type section), the section 47 (a fourth semiconductor section) is an $n^-$ section, and the section 48 (a fifth semiconductor section) is a $p^+$ section. A source terminal S is coupled to the section 45, a drain terminal D is coupled to the section 46, and a body terminal B is coupled to the section 48. A gate terminal G is connected to the section 45 through a gate insulating film 49. The drain terminal D and the gate terminal G are electrically connected, and short-circuited.

Figure 20A:
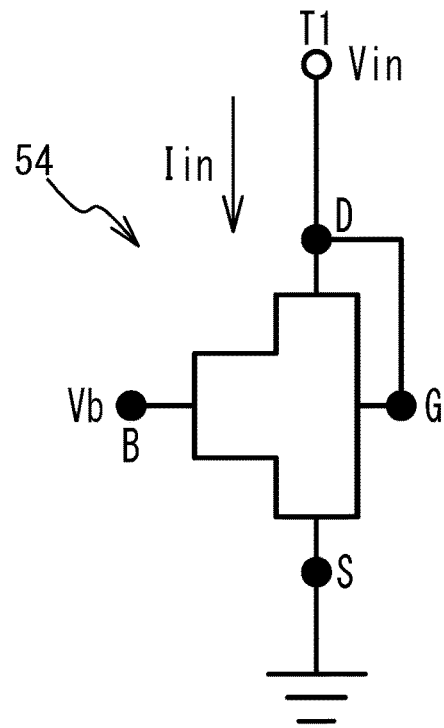
FIG. 20A is a circuit diagram illustrating an example of the connection of the transistor in the third embodiment, and FIG. 20B schematically illustrates current with respect to voltage.
Figure 20B:
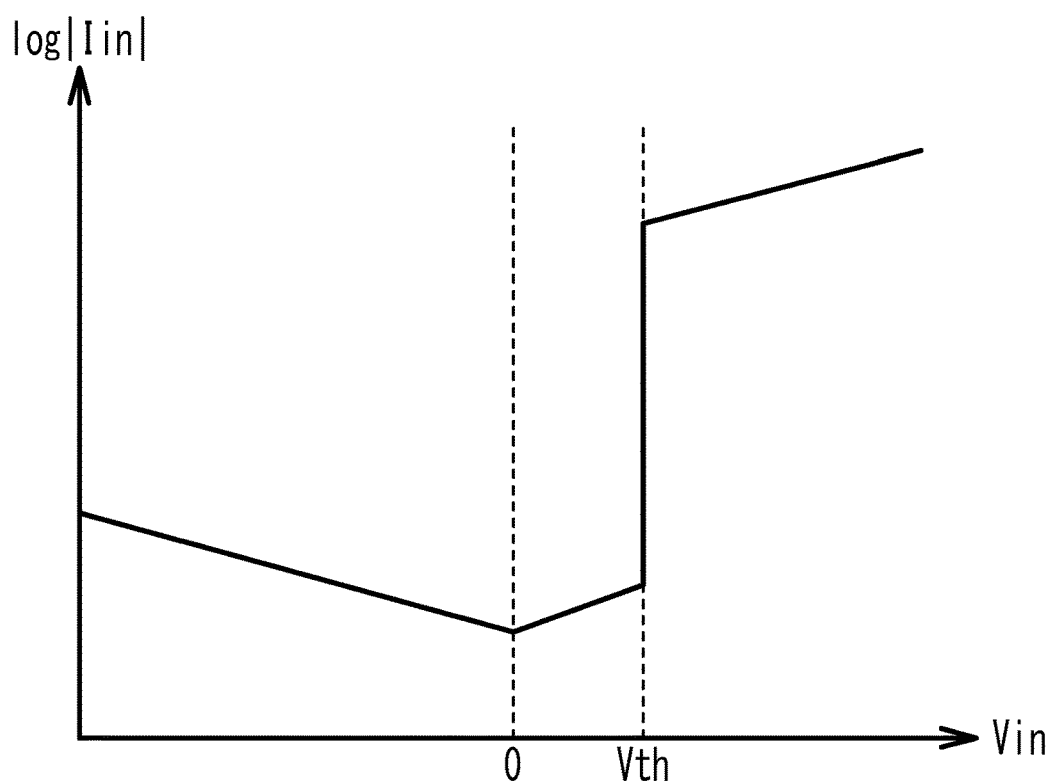

FIG. 20A is a circuit diagram illustrating an example of the connection of the transistor in the third embodiment, and FIG. 20B schematically illustrates current with respect to voltage. As illustrated in FIG. 20A, the source terminal S of the transistor 54 is coupled to a ground, and the drain terminal D is coupled to the terminal T1. A constant voltage Vb is applied to the body terminal B from a voltage supply circuit. The voltage Vb is, for example, 1 V. The preferable voltage of the voltage Vb depends on the doping amount of each of the sections 44 to 48, and is, for example, 1 V or greater. To avoid use of the step-up circuit, the voltage Vb is preferably equal to or less than the power supply voltage at which the current sensor is used. That is, the voltage supply circuit generates the voltage Vb by dividing the power supply voltage by a resistor, for example. The voltage applied to the terminal T1 is represented by Vin, and the current flowing from the terminal T1 to a ground is represented by Iin.

In FIG. 20B, the vertical axis represents the logarithm of the absolute value of the current Iin in log|Iin|. the range where the voltage Vin is negative, the absolute value |Iin| of the current Iin is very small. In the range where the voltage Vin is positive, |Iin| is small at the voltage Vin around 0. When the voltage Vin exceeds the threshold voltage Vth, |Iin| rapidly increases. In other words, when the value of the current Iin exceeds a predetermined range, the resistance state changes to the low-resistance state in which the resistance value is lower than that in the high-resistance state. The threshold voltage Vth is, for example, 0.05 V.

Figure 21A:
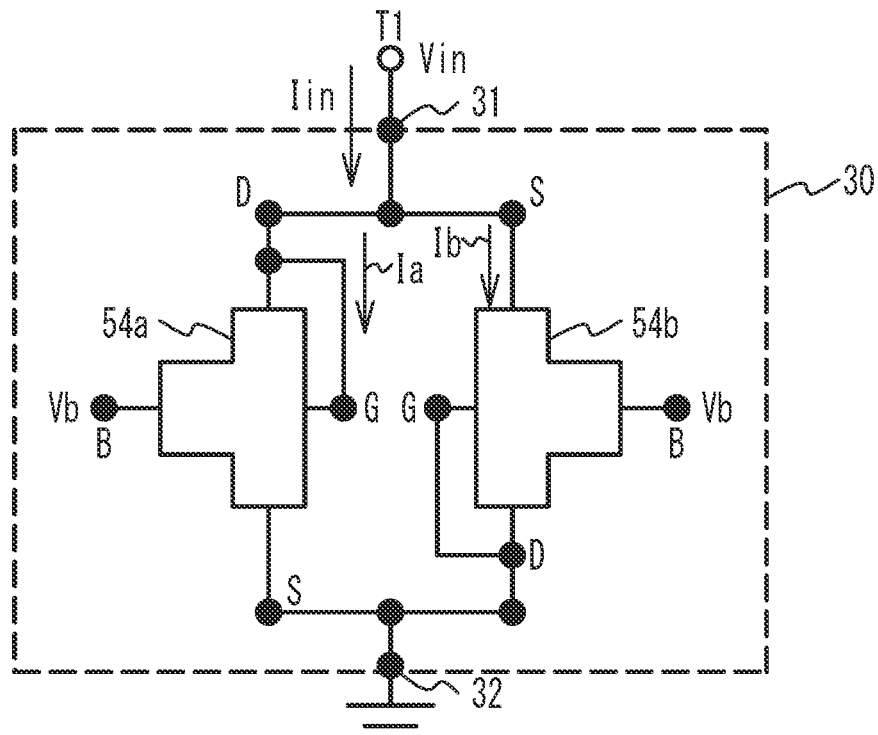
FIG. 21A illustrates a structure of an element 30 used in the third embodiment, and FIG. 21B schematically illustrates current with respect to voltage.
Figure 21B:
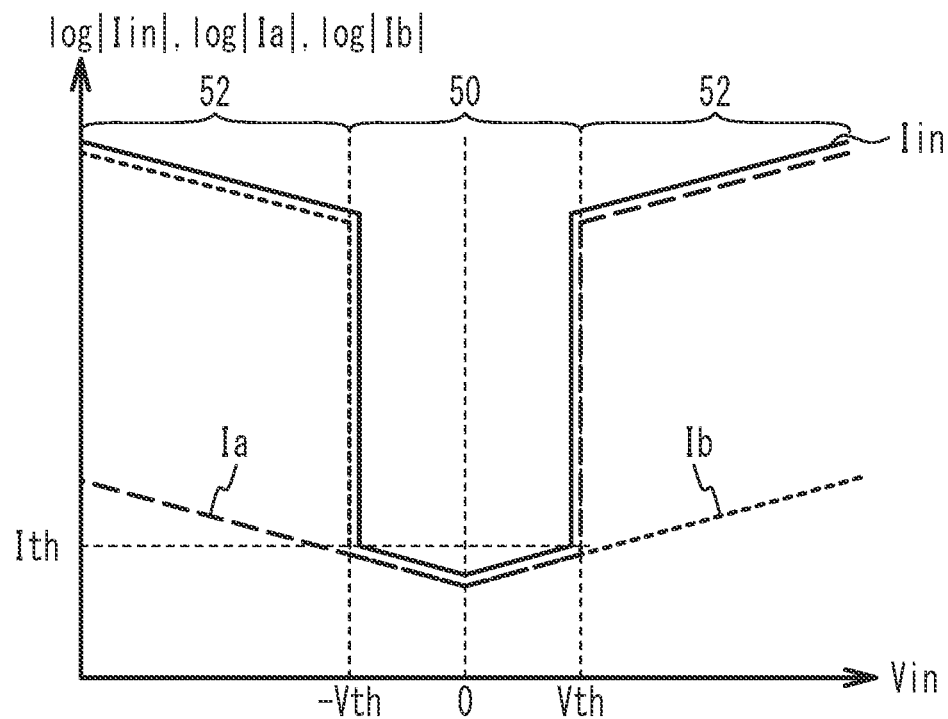

FIG. 21A illustrates details of an element 30 used in the third embodiment, and FIG. 21B schematically illustrates current with respect to voltage. As illustrated in FIG. 21A, the element 30 includes two transistors 54a and 54b. A first end 31 (a first end) and a second end 32 (a second end) of the element 30 are coupled to the terminal T1 and a ground, respectively. The transistors 54a (a first element) and 54b (a second element) are connected in parallel between the first end 31 and the second end 32. The source terminal S of the transistor 54a is coupled to the second end 32, and the drain terminal D is coupled to the first end 31. The source terminal S of the transistor 54b is coupled to the first end 31, and the drain terminal D is coupled to the second end 32. A constant voltage Vb is applied to the body terminals B of the transistors 54a and 54b. The current flowing through the transistor 54a from the first end 31 to the second end 32 is represented by Ia, and the current flowing through the transistor 54b from the first end 31 to the second end 32 is represented by Ib. Current Iin=Ia+Ib.

In FIG. 21B, the vertical axis represents the logarithms of the absolute values of currents in log|Iin|, log|Ia|, and Log|Ib|. Log|Ia| with respect to the voltage Vin is the same as in FIG. 20B. When the voltage Vin becomes greater than the positive threshold voltage Vth, |Ia| rapidly increases. Log|Ib| with respect to the voltage Vin is obtained by inverting in FIG. 20B with respect to the voltage Vin. When the voltage Vin becomes less than the negative threshold voltage −Vth, |Ib| rapidly increases. In the range 50 where the absolute value of the voltage Vin is equal to or less than the threshold voltage Vth (i.e., the absolute value of the current Iin is equal to or less than the threshold current Ith), |Iin| is small. That is, the resistance between the terminal T1 and a ground in the element 30 becomes low. In the range 52 where the absolute value of the voltage Vin is greater than the threshold voltage Vth (i.e., the absolute value of the current Iin is greater than the threshold current Ith), |Iin| is large. That is, the resistance between the terminal T1 and a ground in the element 30 becomes high. That is, the element 30 illustrated in FIG. 21A changes to the low-resistance state in which the resistance value is lower than that in the high-resistance state when the absolute value of the current exceeds a predetermined range.

The element or the circuit used in the first and second embodiments and the variations thereof may be a two-terminal element that enters the high-resistance state without being controlled from the outside when the absolute value of the current Iin is within the range 50 that is lower than the range 52, and enters the low-resistance state without being controlled from the outside when the absolute value of the current Iin is within the range 52, as with the element 10 in FIG. 1C. Use of the two-terminal element eliminates the need to use the circuit for switching the resistance state. Therefore, the current sensor with a small circuit size can be achieved.

As in the third embodiment, the element may be two elements: a first element and a second element that are connected in parallel, as with the element 30 in FIG. 21A. This configuration has similar I-V characteristics to the element 10, as illustrated in FIG. 21B. Therefore, the element 30 may be used instead of the element 10 of the first and second embodiments and the variations thereof. In the element 10 of the first embodiment, the material that is not often used in the semiconductor process, such as $VO_2$, is used. On the other hand, the element 30 using the transistor 54 can be formed using a typical semiconductor process.

In the element 30, the gate terminal G other than the terminals through which the currents Ia and Ib flow is short-circuited to the drain terminal D, and a fixed bias is applied to the body terminal B as illustrated in FIG. 21A. This structure makes it possible to switch the resistance state according to the magnitudes of the currents Ia and Ib without applying the control voltage from the external circuit. Therefore, it is not necessary to use the circuit for switching the resistance state, and the current sensor can be therefore miniaturized.

[Example of a System in which the Power Conversion Circuit is Used]

Figure 22:
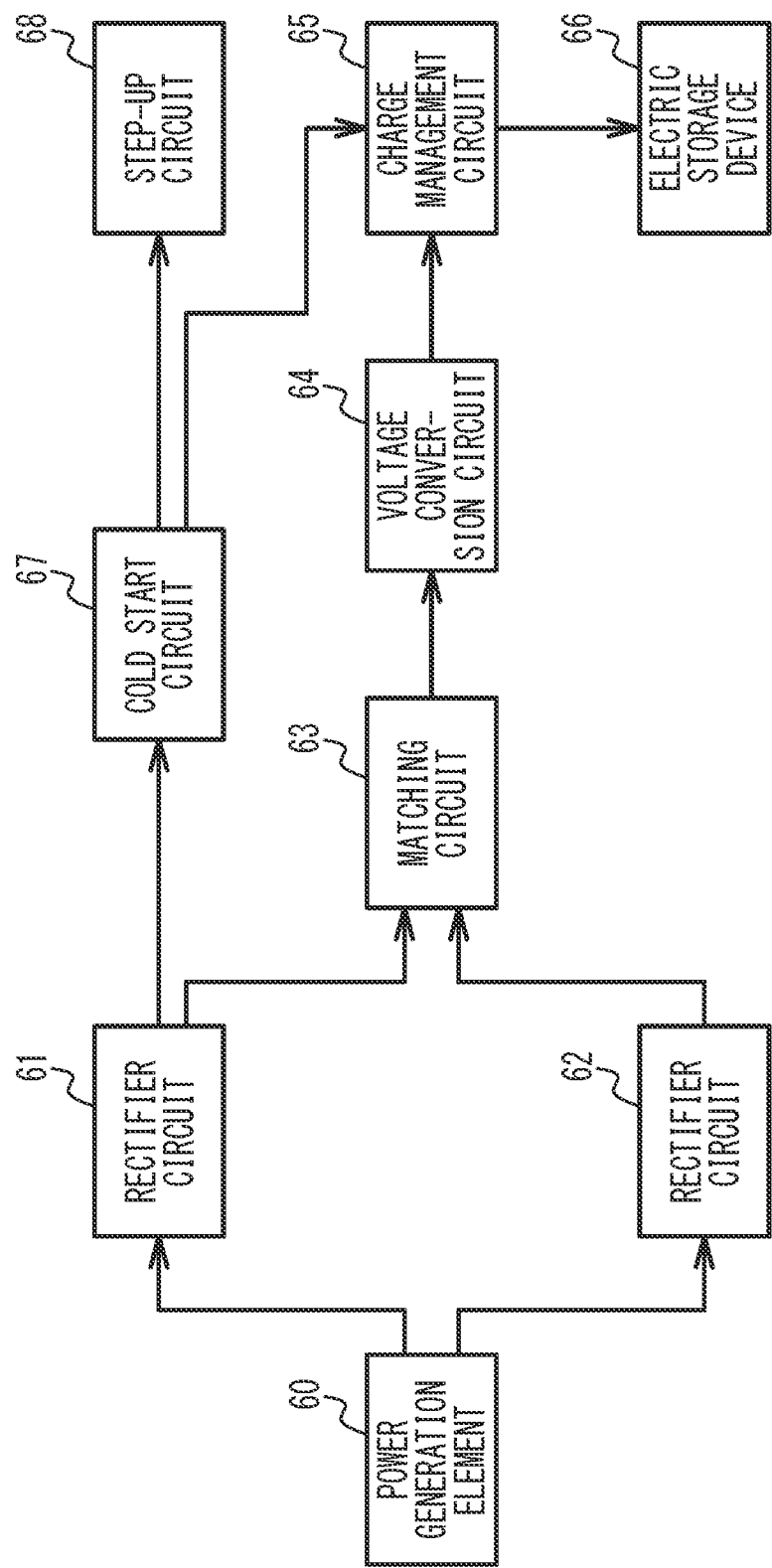
FIG. 22 is a block diagram illustrating a system in which the power conversion circuit of any one of the second embodiment and the variations thereof is used.

FIG. 22 is a block diagram illustrating a system in which the power conversion circuit of any one of the second embodiment and the variations thereof is used. As illustrated in FIG. 22, the system includes a power generation element 60, rectifier circuits 61 and 62, a matching circuit 63, a voltage conversion circuit 64, a charge management circuit 65, an electric storage device 66, a cold start circuit 67, and a step-up circuit 68.

The power generation element 60 is, for example, an energy harvesting element, and is a vibration power generation element such as micro electro mechanical systems (MEMS). The power generation element 60 generates AC power with fine current. The rectifier circuit 61 is, for example, a diode bridge, and the rectifier circuit 62 is, for example, a synchronous rectifier circuit. The matching circuit 63 matches the output impedances of the rectifier circuits 61 and 62 with the input impedance of the voltage conversion circuit 64. The voltage conversion circuit 64 is, for example, a DC (direct current)-DC converter. The charge management circuit 65 stores power in an appropriate one of the electric storage devices 66. The electric storage device 66 is, for example, a capacitor. The charge management circuit 65 monitors the voltages of both ends of each of the electric storage devices 66, and stores the generated power in the appropriate electric storage device. The cold start circuit 67 stores the output current of the rectifier circuit 61 in the electric storage device 66 when the electric storage device 66 is not almost charged. The step-up circuit 68 is, for example, a charge pump, and generates the voltage used in the rectifier circuit 62 and the voltage conversion circuit 64.

The operation of the system will be described. In the state in which the electric storage device 66 is little charged, when the power generation element 60 generates fine power, the rectifier circuit 61 rectifies the fine power. The rectifier circuit 61 can perform rectification without the external power supply like a diode bridge. The current rectified by the rectifier circuit 61 reaches the charge management circuit 65 through the cold start circuit 67 to be stored in the electric storage device 66. When the electric storage device 66 is charged to an efficient voltage, the step-up circuit 68 boosts the voltage of the electric storage device 66 to the voltage used in the rectifier circuit 62 and the voltage conversion circuit 64. The voltage of the electric storage device 66 is, for example, 1 V, and the output voltage of the step-up circuit 68 is, for example, 2 V. When the rectifier circuit 62 and the voltage conversion circuit 64 operate using the voltage of the electric storage device 66, the step-up circuit 68 may be omitted.

The matching circuit 63 varies the input voltages of the rectifier circuits 61 and 62 according to the power generation amount of the power generation element 60. Thereby, the output impedance of the power generation element 60 is matched with the input impedances of the rectifier circuits 61 and 62. The matching circuit 63 switches the rectifier circuits 61 and 62 according to the input voltage. For example, in the case that the rectifier circuits 61 and 62 are a diode bridge and a synchronous rectifier circuit, respectively, when the input voltage becomes 1 V or less, the loss due to the voltage drop of the diode increases. Thus, the rectifier circuit 62 is used. When the input voltage is 1 V or greater, the rectifier circuit 61 is used.

The voltage conversion circuit 64 converts the input voltage set by the matching circuit 63 to the voltage that charges the electric storage device 66. The voltage of the electric storage device 66 is, for example, 1 V or 3.3 V. The charge management circuit 65 monitors the voltages of the electric storage devices 66, and stores the generated power in the appropriate electric storage device 66.

The system employing the power generation element 60 that generates such a fine current is required to reduce the loss. Thus, the synchronous rectifier circuit in accordance with any one of the second embodiment and the first variation thereof is used as the rectifier circuit 62, and the step-down circuit in accordance with the second variation of the second embodiment is used as the voltage conversion circuit. This can reduce the loss of the current sensor, and reduce the loss in the system.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 30 element
12 substrate
14 resistance element
14a active portion
14b extraction portions
16a, 16b electrode
20, 20a detector
21 current sensor
22 comparator
24 differential integration circuit
26 hysteresis determination device
28 control unit
54, 54a, 54b transistor

The invention claimed is:

1. A current sensor comprising:
a resistance element that is connected between a first terminal and a second terminal, enters a high-resistance state when an absolute value of a current flowing between the first terminal and the second terminal is within a first range, and changes to a low-resistance state in which a resistance value is lower than that in the high-resistance state when the absolute value of the current exceeds the first range; and
a circuit that senses a value of the current based on at least one of voltages of the first terminal and the second terminal;
wherein the resistance element is in the high-resistance state when a temperature of the resistance element is within a first temperature range, and the resistance element is in the low-resistance state when the temperature is higher than the first temperature range.

2. The current sensor according to claim 1, wherein the circuit senses the value of the current based on a difference between the voltages of the first terminal and the second terminal.

3. The current sensor according to claim 1, wherein the circuit senses the value of the current based on the voltage of the first terminal and a reference voltage that is supplied.

4. The current sensor according to claim 1, wherein the resistance element is a two-terminal element.

5. The current sensor according to claim 1, wherein the resistance element includes $VO_2$, $NbO_2$, or $Ti_2O_3$.

6. A power conversion circuit comprising:
a switch element; and
a control unit that controls turning on and off of the switch element based on an output of the current sensor according to claim 1.

7. The power conversion circuit according to claim 6, wherein the switch element includes:
a first switch element connected between the first terminal and the second terminal,
a second switch element connected between a third terminal and a fourth terminal,
a third switch element connected between the first terminal and the fourth terminal, and
a fourth switch element connected between the second terminal and the third terminal,
wherein the element is coupled to one of the following locations: between the first terminal and the first and third switch elements, and between the second terminal and the first and fourth switch elements, and
wherein the control unit turns the first switch element and the second switch element from OFF to ON and the third switch element and the fourth switch element from ON to OFF based on change of a sign of the current, and turns the first switch element and the second switch element from ON to OFF and the third switch element and the fourth switch element from OFF to ON based on next change of the sign of the current.

8. A current sensor comprising:
an element that is connected between a first terminal and a second terminal, enters a high-resistance state when an absolute value of a current flowing between the first terminal and the second terminal is within a first range, and changes to a low-resistance state in which a resistance value is lower than that in the high-resistance state when the absolute value of the current exceeds the first range; and
a circuit that senses a value of the current based on at least one of voltages of the first terminal and the second terminal;
wherein the element includes a first element and a second element that are connected in parallel between the first terminal and the second terminal, each of the first and second elements entering the high-resistance state without being controlled from an outside circuit of the current sensor when a partial current flowing from a first end to a second end is equal to or less than a threshold current, and entering the low-resistance state without being controlled from the outside circuit when the partial current flowing from the first end to the second end is greater than the threshold current, and
wherein the first end of the first element is coupled to the first terminal, the second end of the first element is coupled to the second terminal, the first end of the second element is coupled to the second terminal, and the second end of the second element is coupled to the first terminal.

9. A current sensor comprising:
a resistance element that is connected between a first terminal and a second terminal, enters a high-resistance state without being controlled from an outside circuit of the current sensor when an absolute value of a current flowing between the first terminal and the second terminal is within a first range, and enters a low-resistance state in which a resistance value is lower than that in the high-resistance state without being controlled from the outside circuit when the absolute value of the current is within a second range higher than the first range,
wherein the resistance element is in the high-resistance state when a temperature of the resistance element is within a first temperature range, and the resistance element is in the low-resistance state when the temperature is higher than the first temperature range, and the current sensor senses the current.

10. A power conversion circuit comprising:
a switch element; and
a control unit that controls turning on and off of the switch element based on an output of the current sensor according to claim 9.

11. The power conversion circuit according to claim 10, wherein the switch element includes:
- a first switch element connected between the first terminal and the second terminal,
- a second switch element connected between a third terminal and a fourth terminal,
- a third switch element connected between the first terminal and the fourth terminal, and
- a fourth switch element connected between the second terminal and the third terminal, wherein the element is coupled to one of the following locations: between the first terminal and the first and third switch elements, and between the second terminal and the first and fourth switch elements, and wherein the control unit turns the first switch element and the second switch element from OFF to ON and the third switch element and the fourth switch element from ON to OFF based on change of a sign of the current, and turns the first switch element and the second switch element from ON to OFF and the third switch element and the fourth switch element from OFF to ON based on next change of the sign of the current.

* * * * *